US012614007B2

(12) United States Patent
Toriumi et al.

(10) Patent No.: US 12,614,007 B2
(45) Date of Patent: Apr. 28, 2026

(54) CONSTRUCTION-MODEL-CREATING DEVICE AND CONSTRUCTION-MODEL-CREATING METHOD

(71) Applicant: Hitachi, Ltd., Tokyo (JP)

(72) Inventors: Wataru Toriumi, Tokyo (JP);
Masayasu Fujiwara, Tokyo (JP);
Takahiro Hatori, Tokyo (JP)

(73) Assignee: HITACHI, LTD., Tokyo (JP)

( * ) Notice: Subject to any disclaimer, the term of this patent is extended or adjusted under 35 U.S.C. 154(b) by 913 days.

(21) Appl. No.: 17/795,899

(22) PCT Filed: Feb. 4, 2021

(86) PCT No.: PCT/JP2021/004080
§ 371 (c)(1),
(2) Date: Jul. 28, 2022

(87) PCT Pub. No.: WO2021/171949
PCT Pub. Date: Sep. 2, 2021

(65) Prior Publication Data
US 2023/0112206 A1 Apr. 13, 2023

(30) Foreign Application Priority Data
Feb. 28, 2020 (JP) ................................. 2020-032577

(51) Int. Cl.
*G06F 30/13* (2020.01)
*G06Q 50/08* (2012.01)
(52) U.S. Cl.
CPC ............. *G06F 30/13* (2020.01); *G06Q 50/08* (2013.01)

(58) Field of Classification Search
CPC ................................. G06F 30/13; G06Q 50/08
(Continued)

(56) References Cited

U.S. PATENT DOCUMENTS

2002/0029129 A1   3/2002   Satoh et al.
2018/0260497 A1   9/2018   Vanker et al.

FOREIGN PATENT DOCUMENTS

CN        120781424 A  * 10/2025
JP      2001-295480 A    10/2001
(Continued)

OTHER PUBLICATIONS

International Search Report of PCT/JP2021/004080 dated Apr. 6, 2021.
(Continued)

*Primary Examiner* — Justin C Mikowski
(74) *Attorney, Agent, or Firm* — MATTINGLY & MALUR, PC

(57) ABSTRACT

A construction-model-creating device with reduced design man-hours is realized. In equipment specifications including at least a positional relationship with a passage, specifications not determined by a user are enumerated based on specifications determined by the user and search conditions determined by the user according to the search conditions, and at least one of layout candidates representing a positional relationship between the equipment in the building and the passage is generated. When one of the generated layout candidates is selected by the user, an in-building equipment construction model part group reflecting a position, an orientation, specifications, and so on of the selected layout candidate is generated.

13 Claims, 19 Drawing Sheets

(58) Field of Classification Search
    USPC ............................................................ 703/1
    See application file for complete search history.

(56)                    References Cited

FOREIGN PATENT DOCUMENTS

| JP | 2004-185444 A | 7/2004 |
| JP | 2014-010676 A | 1/2014 |
| JP | 5619113 B2 | 11/2014 |

OTHER PUBLICATIONS

Extended European Search Report received in corresponding European Application No. 21761641.6 dated Feb. 12, 2024.

* cited by examiner

Figure 8:
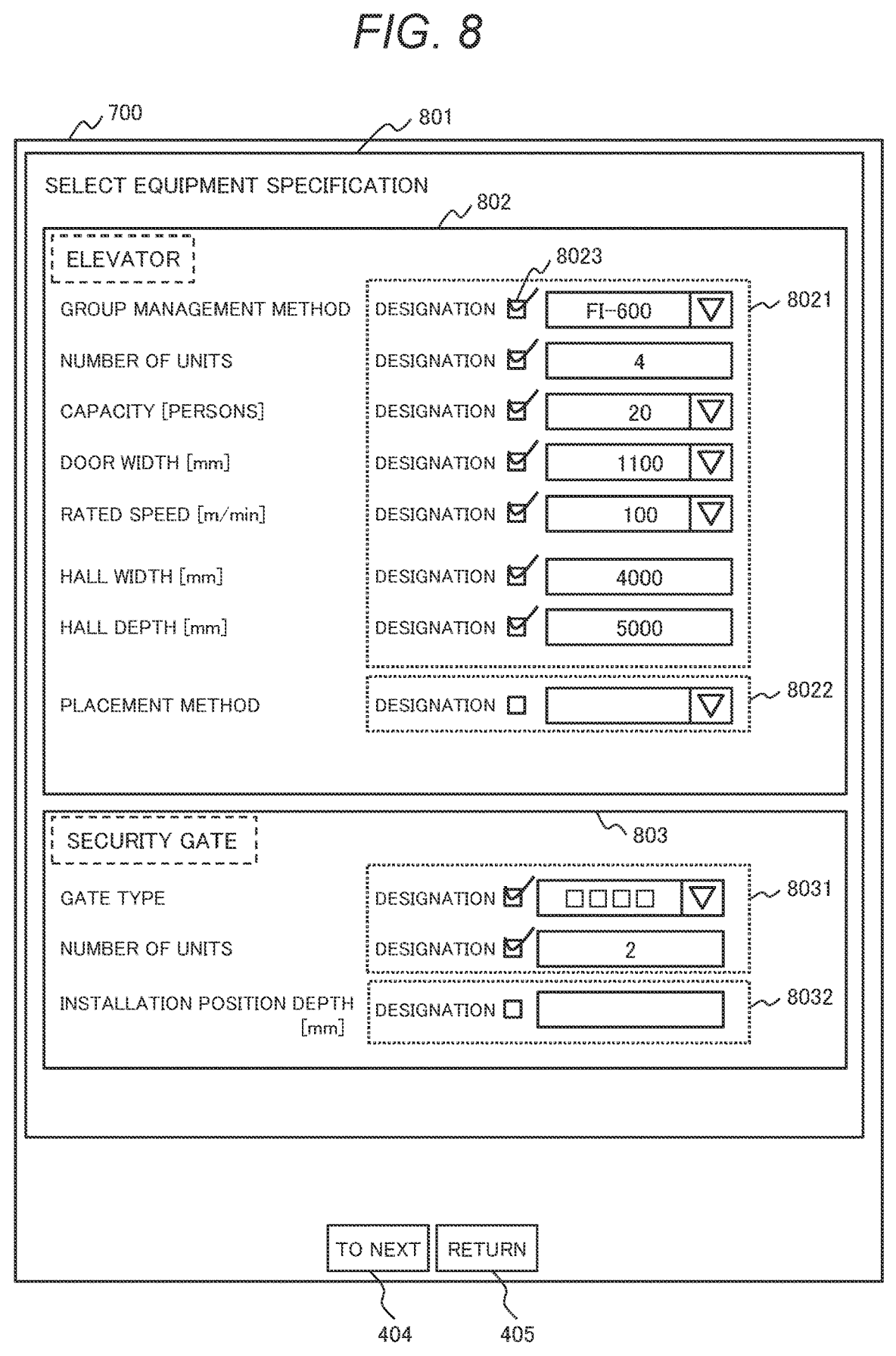

SELECT EQUIPMENT SPECIFICATION

802

┌ ─ ─ ─ ─ ─ ─ ┐
│ ELEVATOR │
└ ─ ─ ─ ─ ─ ─ ┘

8023

| | | | | |
|---|---|---|---|---|
| GROUP MANAGEMENT METHOD | DESIGNATION ☑ | FI-600 ▽ | | 8021 |
| NUMBER OF UNITS | DESIGNATION ☑ | 4 | | |
| CAPACITY [PERSONS] | DESIGNATION ☑ | 20 ▽ | | |
| DOOR WIDTH [mm] | DESIGNATION ☑ | 1100 ▽ | | |
| RATED SPEED [m/min] | DESIGNATION ☑ | 100 ▽ | | |
| HALL WIDTH [mm] | DESIGNATION ☑ | 4000 | | |
| HALL DEPTH [mm] | DESIGNATION ☑ | 5000 | | |
| PLACEMENT METHOD | DESIGNATION ☐ | ▽ | | 8022 |

803

┌ ─ ─ ─ ─ ─ ─ ─ ─ ┐
│ SECURITY GATE │
└ ─ ─ ─ ─ ─ ─ ─ ─ ┘

| | | | | |
|---|---|---|---|---|
| GATE TYPE | DESIGNATION ☑ | ☐ ☐ ☐ ▽ | | 8031 |
| NUMBER OF UNITS | DESIGNATION ☑ | 2 | | |
| INSTALLATION POSITION DEPTH [mm] | DESIGNATION ☐ | | | 8032 |

| TO NEXT | RETURN |
|---|---|

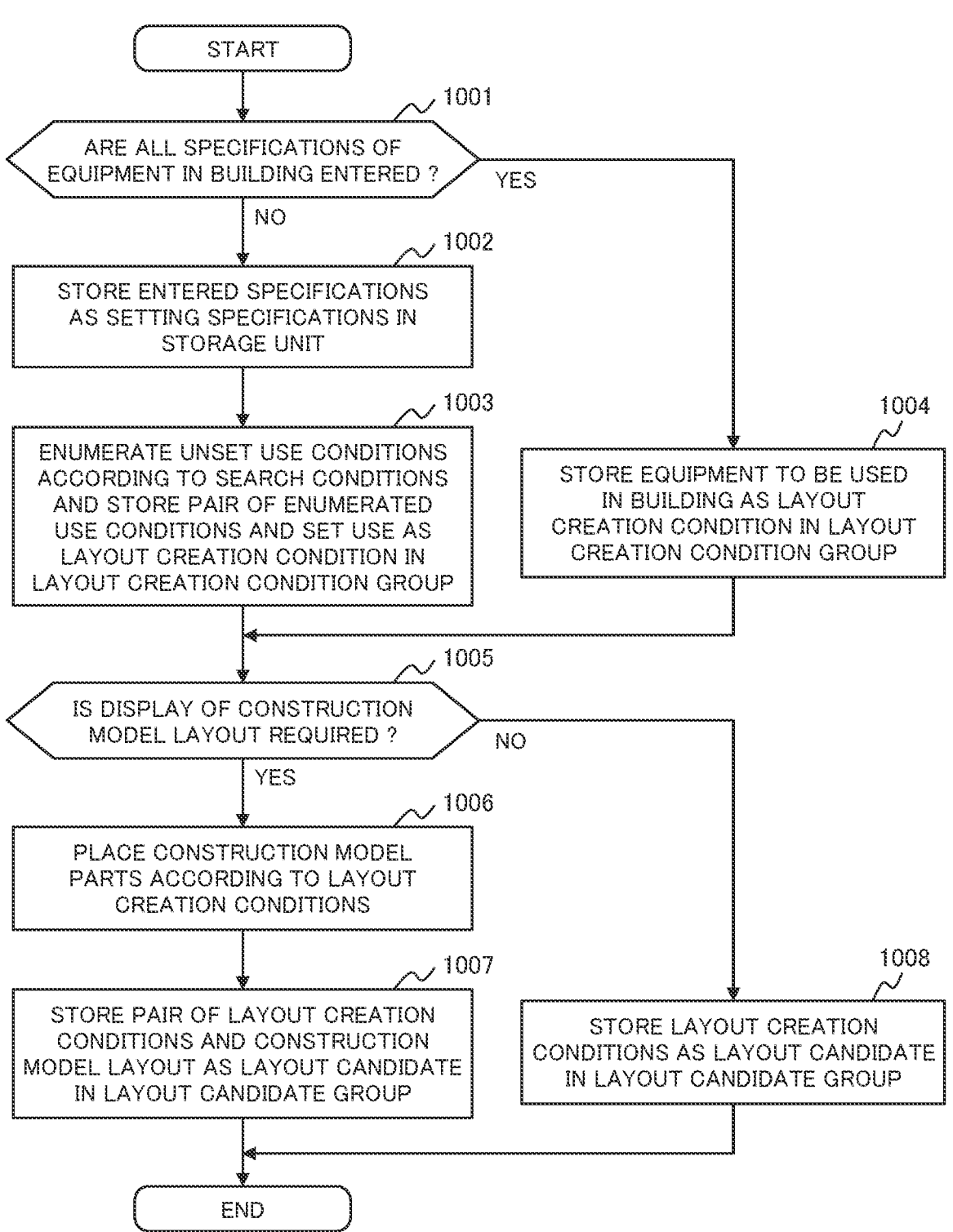

START

1001
ARE ALL SPECIFICATIONS OF EQUIPMENT IN BUILDING ENTERED ?　YES

NO

1002
STORE ENTERED SPECIFICATIONS AS SETTING SPECIFICATIONS IN STORAGE UNIT

1003
ENUMERATE UNSET USE CONDITIONS ACCORDING TO SEARCH CONDITIONS AND STORE PAIR OF ENUMERATED USE CONDITIONS AND SET USE AS LAYOUT CREATION CONDITION IN LAYOUT CREATION CONDITION GROUP

1004
STORE EQUIPMENT TO BE USED IN BUILDING AS LAYOUT CREATION CONDITION IN LAYOUT CREATION CONDITION GROUP

1005
IS DISPLAY OF CONSTRUCTION MODEL LAYOUT REQUIRED ?　NO

YES

1006
PLACE CONSTRUCTION MODEL PARTS ACCORDING TO LAYOUT CREATION CONDITIONS

1007
STORE PAIR OF LAYOUT CREATION CONDITIONS AND CONSTRUCTION MODEL LAYOUT AS LAYOUT CANDIDATE IN LAYOUT CANDIDATE GROUP

1008
STORE LAYOUT CREATION CONDITIONS AS LAYOUT CANDIDATE IN LAYOUT CANDIDATE GROUP

END

ENTER SEARCH CONDITION

1401

GATE INSTALLATION POSITION DEPTH [mm]

| MINIMUM VALUE | 0 | SEARCH UNIT | 1000 | MAXIMUM VALUE | 1000 |

9011        9012        9013

1402

PERSONNEL IN BUILDING (PERSONS)    1000

ELEVATOR 5-MINUTE TRANSPORT CAPACITY (%)

| MINIMUM VALUE | 15.0 | MAXIMUM VALUE | 16.0 |

14021          14022

ELEVATOR AVERAGE OPERATING INTERVAL (s)

| MINIMUM VALUE | 30 | MAXIMUM VALUE | 50 |

INSTALLATION COST (YEN)

| MINIMUM VALUE | 1 | MAXIMUM VALUE | 100,000,000 |

OCCUPIED AREA (m²)

| MINIMUM VALUE | 1 | MAXIMUM VALUE | 25 |

INSTALLATION AREA (mm)       1403

X: | MINIMUM VALUE | 0 | MAXIMUM VALUE | 5000 |

Y: | MINIMUM VALUE | 1000 | MAXIMUM VALUE | 6000 |

SELECTION 14031        14032

TO NEXT    RETURN 404       405

SELECT DESIRED LAYOUT (A) ☐ 1201                                    1202                (B) ☑

Figure 18:
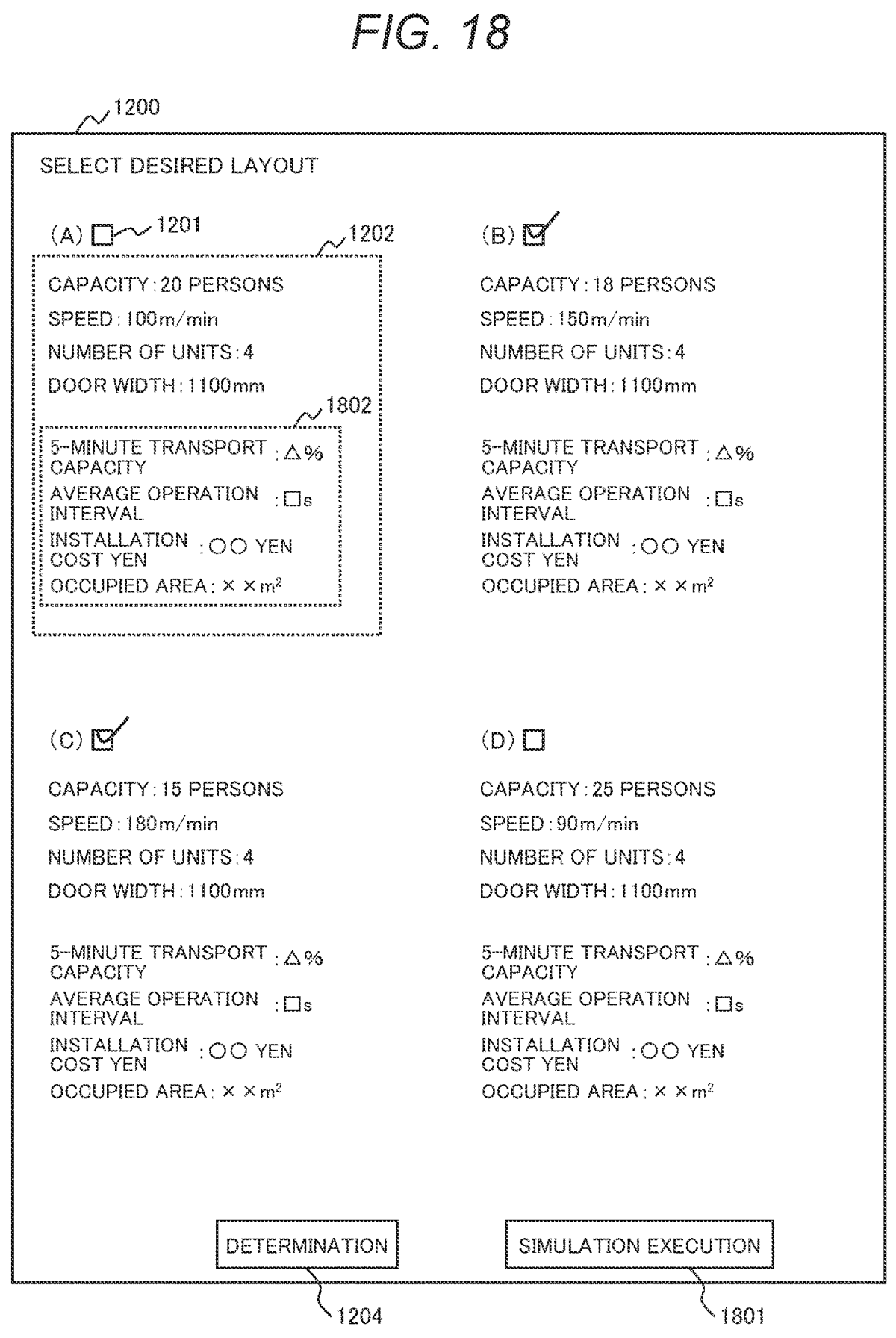

CAPACITY : 20 PERSONS                          CAPACITY : 18 PERSONS

SPEED : 100m/min                               SPEED : 150m/min

NUMBER OF UNITS : 4                            NUMBER OF UNITS : 4

DOOR WIDTH : 1100mm                            DOOR WIDTH : 1100mm

1802

5-MINUTE TRANSPORT : △%                        5-MINUTE TRANSPORT : △%
CAPACITY                                       CAPACITY
AVERAGE OPERATION : ☐s                         AVERAGE OPERATION : ☐s
INTERVAL                                       INTERVAL
INSTALLATION : ○○ YEN                          INSTALLATION : ○○ YEN
COST YEN                                       COST YEN
OCCUPIED AREA : × ×m²                          OCCUPIED AREA : × ×m²

(C) ☑                                          (D) ☐

CAPACITY : 15 PERSONS                          CAPACITY : 25 PERSONS

SPEED : 180m/min                               SPEED : 90m/min

NUMBER OF UNITS : 4                            NUMBER OF UNITS : 4

DOOR WIDTH : 1100mm                            DOOR WIDTH : 1100mm

5-MINUTE TRANSPORT : △%                        5-MINUTE TRANSPORT : △%
CAPACITY                                       CAPACITY
AVERAGE OPERATION : ☐s                         AVERAGE OPERATION : ☐s
INTERVAL                                       INTERVAL
INSTALLATION : ○○ YEN                          INSTALLATION : ○○ YEN
COST YEN                                       COST YEN
OCCUPIED AREA : × ×m²                          OCCUPIED AREA : × ×m²

| DETERMINATION |        | SIMULATION EXECUTION |

1204                                           1801

CONSTRUCTION-MODEL-CREATING DEVICE AND CONSTRUCTION-MODEL-CREATING METHOD

TECHNICAL FIELD

The present invention relates to a building design support system.

BACKGROUND ART

In recent years, building design using construction model data listed in Building Information Modeling (BIM) data has been promoted with the aim of reducing the design man-hours of buildings. As a related technology, Patent Literature 1 has obtained the effect of improving the visibility and efficiency of the design by generating an appropriate elevator layout screen based on the specifications of an elevator entered by a user.

CITATION LIST

Patent Literature
    PTL 1: Japanese Patent No. 5619113

SUMMARY OF INVENTION

Technical Problem

In Patent Literature 1, there is no disclosure of a technique for creating a construction model layout in which a construction part simulating equipment in a building and a passage part simulating a floor or passageway are disposed. An object to be solved by the present invention is to provide a technique for reducing man-hours in the creation of construction model layouts by creating a construction model layout in which an area necessary for the effect of the function of the equipment in the building is exhibited.

Solution to Problem

In order to solve the above problems, one of representative construction-model-creating devices according to the present invention is a construction-model-creating device that outputs a layout candidate of a construction model layout in which a construction part imitating equipment in a building and having an operating portion and a passage part are placed, including: an arithmetic device that creates the layout candidate in which the construction part and the passage part are placed at a position where all a minimum area required for the equipment in the building to be effective overlaps with the passage part, on a two-dimensional plane when the construction model layout is viewed from directly above; and an output unit that outputs the layout candidate created by the arithmetic device.

Advantageous Effects of Invention

According to the present invention, a reduction in the number of man-hours in the creation of the construction model layout can be expected.

BRIEF DESCRIPTION OF DRAWINGS

FIG. 8 is a diagram showing an example of the specification setting screen according to the present invention.

FIG. 10 is a diagram showing an example of a layout candidate group generation process according to the present invention.

FIG. 14 is a diagram showing an example of the specification setting screen according to the present invention.

FIG. 18 is a diagram showing an example of the layout selection screen according to the present invention.

DESCRIPTION OF EMBODIMENTS

In the following description, design data of an entire building is referred to as "construction model data", and element data corresponding to floors, walls, pillars, stairs, elevators, escalators, and so on configuring the construction model data is referred to as "construction model parts".

Example 1

Figure 1:
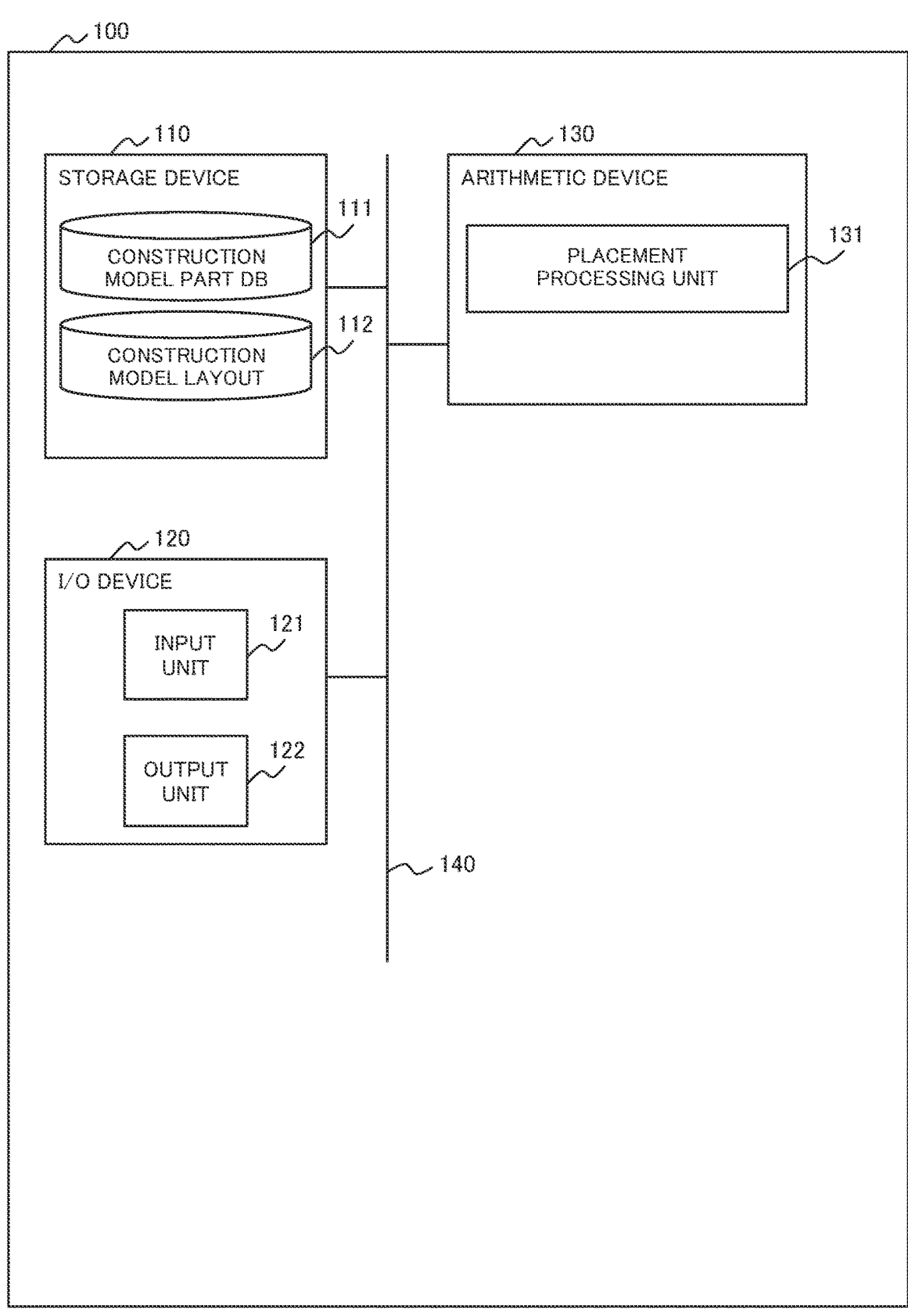
FIG. 1 is a diagram showing an example of a configuration of a construction-model-creating device according to the present invention.

The configuration of a device in a first example will be described with reference to FIG. 1.

<Configuration of the Invention>

A construction-model-creating device 100 includes a storage device 110, an I/O device 120, and an arithmetic device 130.

The storage device 110 includes a main storage device such as a DRAM or an SRAM, and an auxiliary storage device such as a hard disk drive or a flash memory, and internally holds a construction model part DB 111 and a construction model layout 112.

The I/O device 120 includes an input unit 121 including an input device such as a mouse or a keyboard, which is operated by a user, and an output unit 122 including an output device such as a display performing a screen display or a printer.

The arithmetic device 130 is a placement processing unit 131 that mainly includes a CPU and performs placement processing of the construction model parts.

A bus 140 is a common circuit for performing data communication between each device.

A computer system configuring the construction-model-creating device 100 may be configured such that multiple computer systems are connected to each other through communication. For example, the storage device 110, the I/O device 120, and the arithmetic device 130 may be realized in a separate computer system, and a communication unit for connecting between the computer systems may be configured by a bus 140.

<Configuration of Data>

Next, data used in the construction-model-creating device 100 will be described.

The construction model part DB 111 is a database of construction model parts used for building design. Specifically, the construction model part DB 111 includes at least one construction model part of passage parts such as floors and passageways, elevators, escalators, automatic doors, security gates, surveillance cameras, sensors such as infrared sensors, and information transmitters such as signages together with specification information.

In this example, the specification information includes first information on equipment itself in the building such as the type and dimensions of the equipment in the building, and performance information peculiar to each device, and second information that is placement information such as an installation position, an orientation, a placement method, and the number of installations. Examples of the performance information specific to the equipment include a capacity, a rated speed, a door width, a stop floor, a stop floor height, and so on in the case of an elevator, a rated speed in the case of an escalator, a door width, a door opening speed, and a door opening method in the case of an automatic door, a throughput in the case of a security gate, and a detection range in the case of a surveillance camera or a motion sensor, and the like. The placement method includes a face-to-face method, a planar method, and the like.

Incidentally, even if the construction part includes at least one piece of the first information, and the specification information is stored in the construction model part DB 111 in association with a corresponding construction model part, the construction model parts themselves may have specification information on the equipment in the building and the passages, which are imitated by the construction model parts.

Further, the construction part has the operating portion 113 at a boundary between the construction part and the outside. In the actual equipment in the building, there is a portion that interacts with the outside in some way. For example, the portion is a portion where a person or thing passes inside or outside the equipment in the building, and a portion that transmits information to the outside or acquires information from the outside.

In the construction part, the portions corresponding to those portions are the operating portions. For example, the entrance and exit portions of the elevators, the passing portions of the security gates, the display unit of the information display device, and the sensing unit of the sensor are the operating portions.

Passing portions 206 of the security gates are regarded as one construction part of devices of multiple security gates such as a security gate 202, and the operating portion is a portion that allows persons and things to enter and exit into the construction part, that is, a gateway to a space between multiple security gates.

The operating portion may be set by the user for each construction part.

Figure 2:
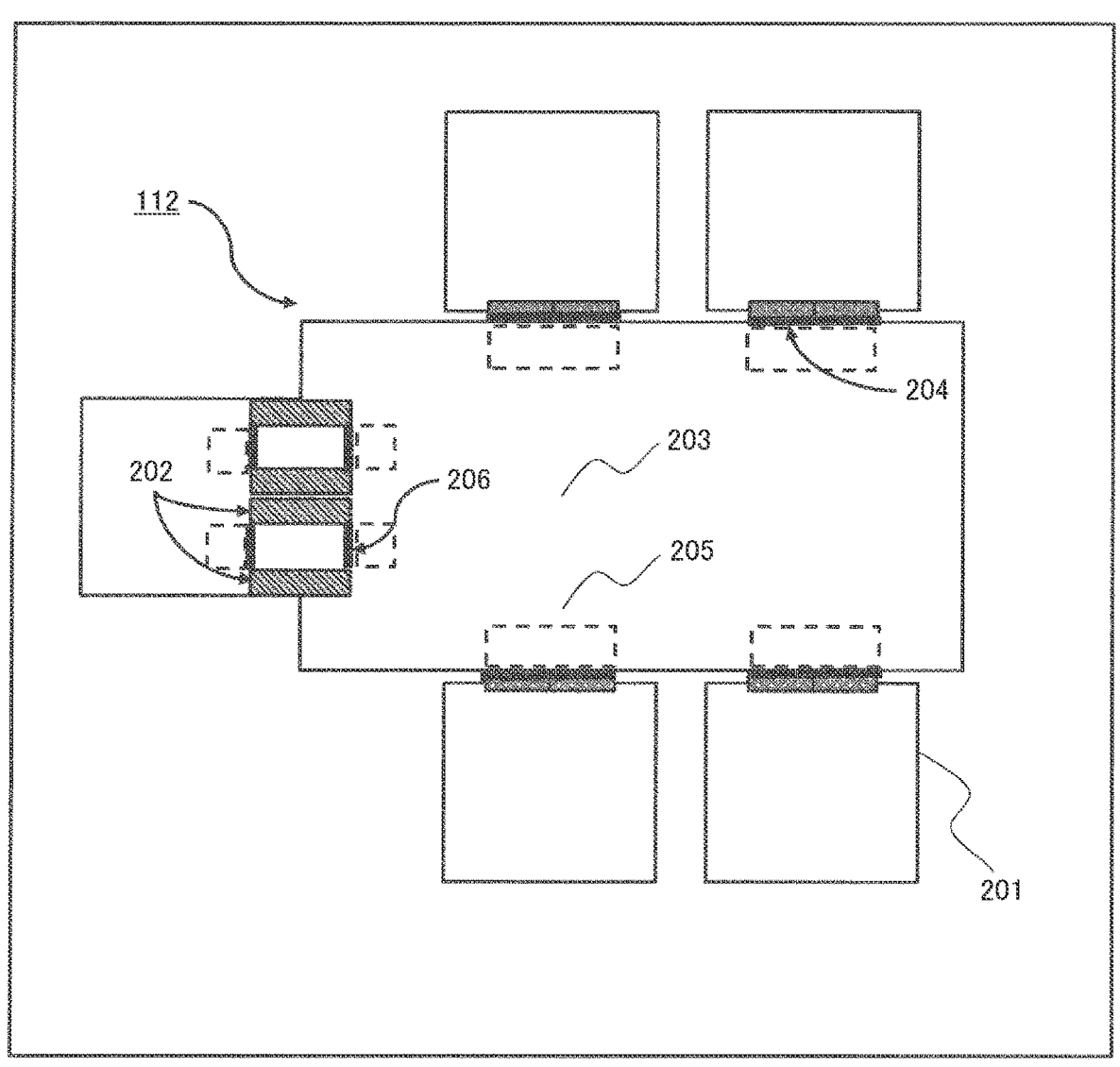
FIG. 2 is a diagram showing one example of a construction model layout created according to the present invention.
Figure 3:
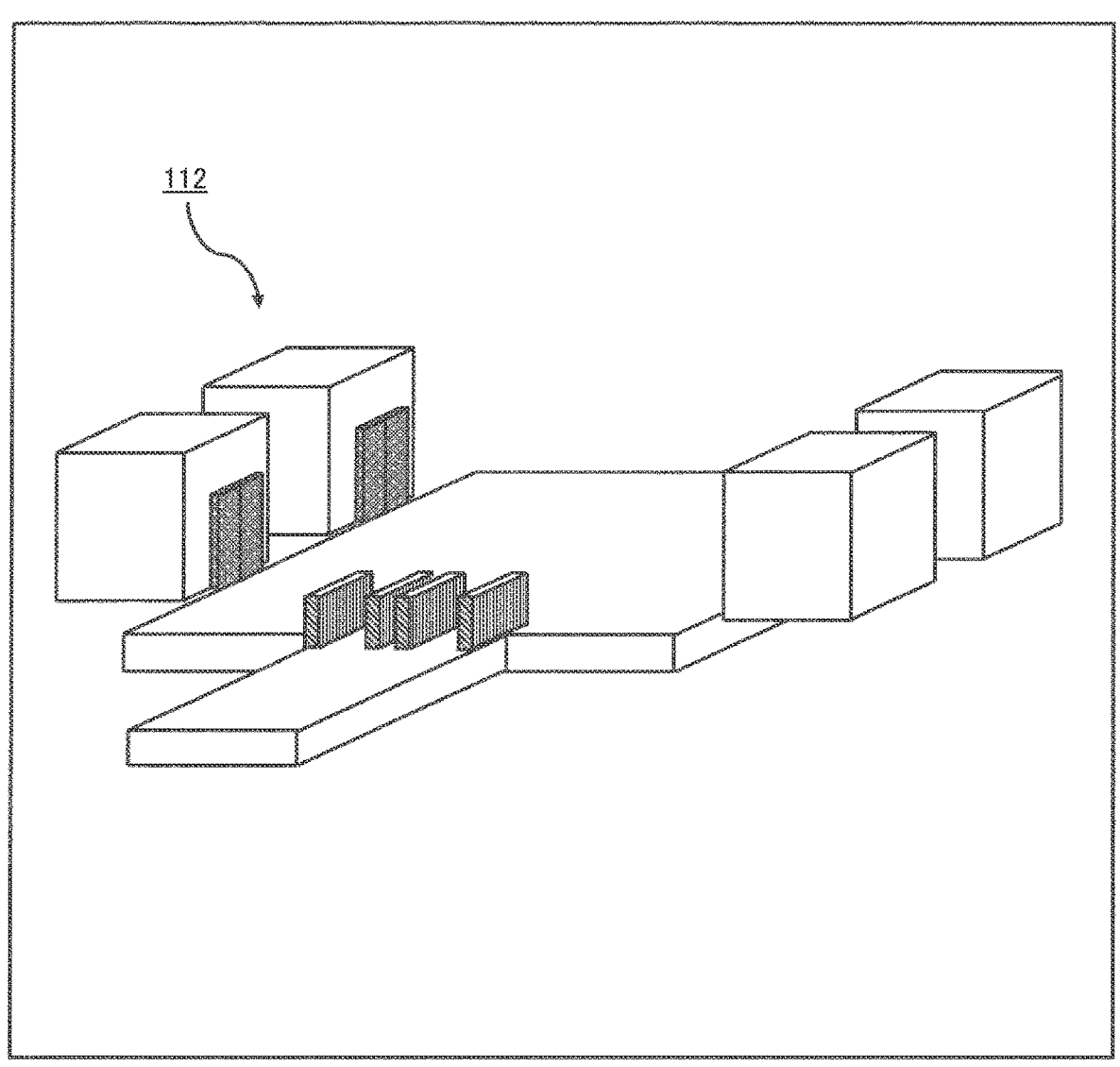
FIG. 3 is a diagram showing an example of the construction model layout created according to the present invention.

Next, the construction model layout 112 will be described with reference to FIGS. 2 and 3. The construction model layout 112 is a part group configured by the combination of construction model parts extracted by the construction model part DB 111, which corresponds to output data of the present invention. The construction model layout 112 includes at least one of information for displaying the building in 2D as shown in FIG. 2 and information for displaying the building in 3D as shown in FIG. 3. In addition, the construction model layout is output in an output unit as a layout candidate.

<Description of Processing>

The process in the placement processing unit 131 will be described with reference to FIGS. 2, 3, 4, and 5.

FIGS. 2 and 3 show examples of a construction model layout in which the construction model parts are placed by the placement processing unit. Construction parts 201 and 202 and a passage part 203 are installed in the construction model layout 112.

A minimum required area 205 is an area that is in contact with the working portions of the construction parts and at a position opposite the construction parts across the operating portions. The minimum required area 205 is a range that exerts the effects of the actual equipment in the building imitated by the construction parts or a minimum range required for exerting the effects. In the case of the construction parts that imitate the elevators, the security gates, and the information display device, the minimum required area 205 is a rectangular area including all the operating portions of those parts and has a width of 50 cm in a vertical direction opposing the operating portion and in a direction away from the construction parts. In the case of the construction parts imitating sensors, the minimum required area 205 is an area including a quarter of the operating portion, and has a depth of 50 cm in a direction perpendicular to a tangential line of the operating portion and in a direction of moving away from the construction part in the included entire operating portion. A space with a depth of 50 cm at minimum allows persons to pass through and the equipment in the building can be effective. Note that the size, range, and the like of the minimum required area may be set by the user.

The placement processing unit 131 performs placement processing of the construction parts and the passage parts at a position where the passage parts and the minimum required area 205 all overlap with each other as a two-dimensional plane from directly above the construction model layout.

When the working portions are placed in a position where all the passage parts and the minimum required area overlap with each other by allowing the operating portions to contact or overlap with the passage parts, the actual building equipment can have some interaction with the outside of the equipment in the building, and the construction model layout secured with the minimum required area for demonstrating the effects of the equipment in the building can be automatically created.

As a result, since the construction model layout not ensured with the area necessary for demonstrating the effects of the function of the equipment in the building is not created, the man-hour for creating the construction model layout can be reduced.

The minimum required area is set for each construction part or is stored in a storage device in association with the corresponding construction part. Note that the above conditions may be set by the user.

In addition, in the case of multiple operating portions and multiple minimum required areas such as the security gates, at least one operating portion may be placed at a position contacting with an area directly above the passage part, and all the minimum required areas may be placed at a position of overlapping with the passage parts.

In this example, in the placement process of the construction parts and the passage parts, all the minimum required areas may be finally placed at the position of overlapping with the passage parts, and there is no need to overlap the minimum required area with the passage parts.

That is, the present invention does not limit the placement processing method such as the placement process is performed by placing the construction part in which the minimum required area is connected to the working portion in advance, and determining whether or not the minimum required area and the passage parts all overlap with each other, or the placement process is performed by placing the construction part in which the minimum required area is not connected to the working portion, and determining whether or not all the minimum required area set on the construction part can overlap with the passage part that contacts the operating portion of the construction part.

The minimum required area may be information stored in the storage device or information created in the arithmetic device.

Further, each construction model part may have attributes. For example, if an elevator hall is a hall attribute, the equipment in the building such as the elevator installed in the elevator hall also has a hall attribute. In addition, information boards for security gates, surveillance cameras, signage, and so on, which are installed in various places such as elevator halls and the passages may have multiple types of attributes such as hall attributes and passage attributes.

When the construction model part has an attribute, the placement process is performed at a position where the construction part and the passage part having at least one of the same attributes come into contact with each other as processing of the placement processing unit. The above placement process is performed so that layouts that are unlikely to be required of the user such as elevators placed in a corridor can also be excluded in advance.

Next, a placement processing flow will be described. As an example, the placement processing flow will be described in two patterns of determining whether the minimum required area is in a position of all overlapping with an area directly above the passage part, or placing the minimum required area at a position of all overlapping with the area directly above the passage part.

Figure 4:
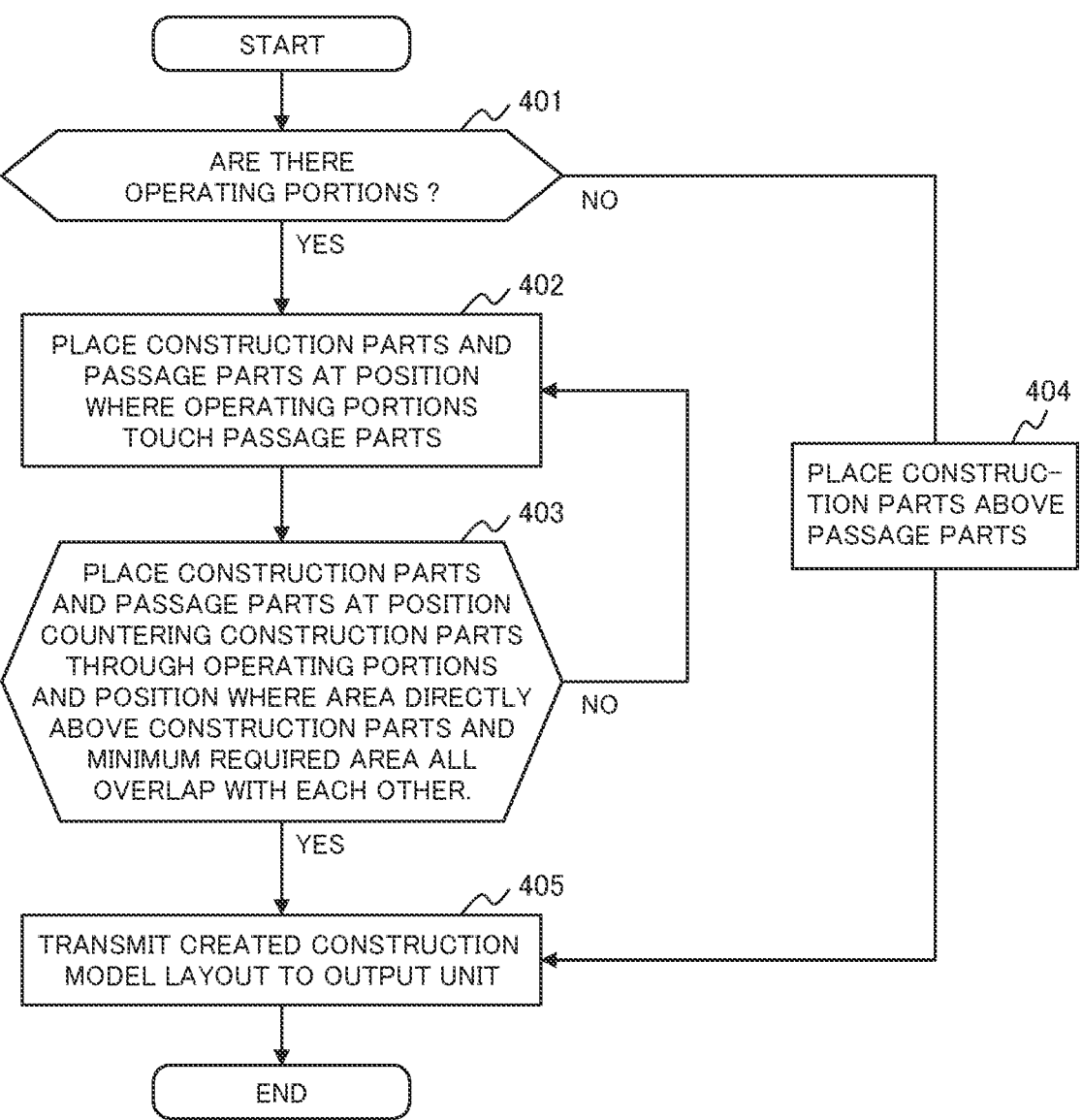
FIG. 4 is a diagram showing an example of the processing of a placement processing unit in the present invention.
Figure 5:
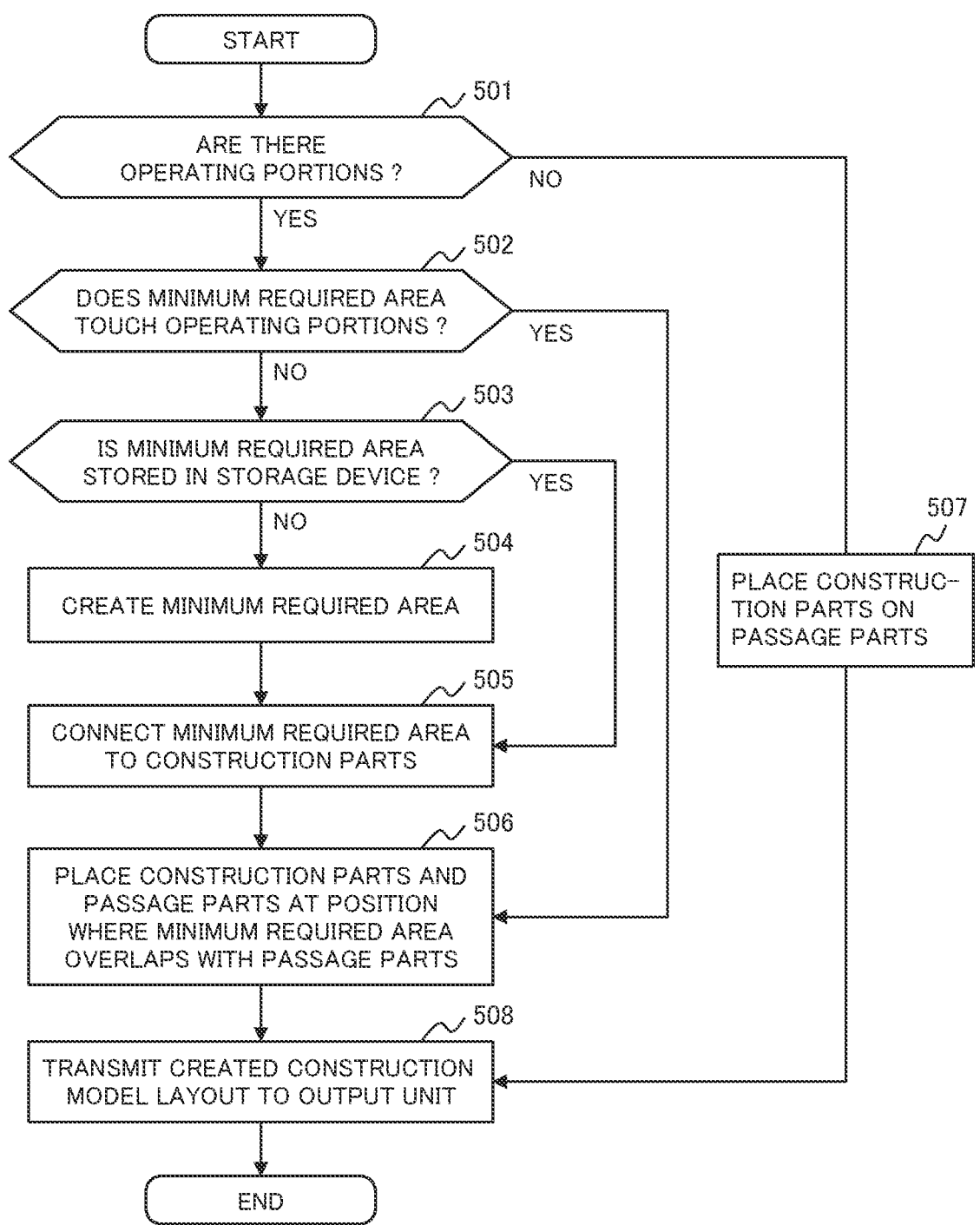
FIG. 5 is a diagram showing an example of the processing of the placement processing unit in the present invention.

First, the placement process for determining whether the minimum required area is in a position of all overlapping will be described with reference to FIG. 4.

In a process 401, it is determined whether or not there is the working portion of the construction part. When there is an operating portion, a process 402 is executed, and when there is no operating portion, a process 404 is executed.

In a process 402, the construction part and the passage part are placed at a position where the operating portion is in contact with or overlaps with the passage part. In the construction model layout, at least one of the construction part and the passage part is placed.

In a process 403, it is determined whether all the minimum required area overlaps in the area directly above the passage part. A process 405 is executed when all the minimum required area is at an overlapping position, and a process 402 is executed when all the minimum required area is not at the overlapping position.

In a process 404, a process of placing the construction part having no working unit on the passage part is executed.

In a process 405, the created construction model layout is transmitted to the output unit.

The above processes 401 to 405 are the contents of the processing in the arithmetic device. It is determined whether all all the minimum required area is at the position overlapping with the area directly above the passage part of the construction model layout of the process 403, and the layout at all overlapping position is output by the output unit, so that the layout in which at least one of the construction part simulating the equipment in the building and the passage part simulating the passage is placed considering the function of the equipment in the building can be automatically created. That is, since a construction model layout can be created and a calculation time can be shortened by excluding layouts that do not consider the functions of the equipment in the building, the man-hours for creating layouts can be reduced.

Next, the placement process in a method in which the minimum required area is placed at a position of all overlapping with the area directly above the passage part will be described.

In a process 501, it is determined whether or not there is an operating portion of the construction part. When there is an operating portion, a process 502 is executed, and when there is no operating portion, a process 507 is executed.

In a process 502, it is determined whether the minimum required area is connected to the construction part. A process 506 is executed when the minimum required area is connected, and a process 503 is executed when not connected.

In the process 503, it is determined whether the minimum required area is stored in the storage device. A process 505 is executed when the minimum required area is stored, and a process 504 is executed when not stored.

In the process 504, a process of creating the minimum required area is performed. For example, a minimum required area creation condition is stored in the storage device, and the arithmetic device performs a creation process according to the creation condition.

In the process 505, connection processing of the construction part and the minimum required area is performed.

In the process 506, the placement processing unit places the construction part and the passage part at a position where the minimum required area all overlaps over the area directly above the passage part.

In the process 507, the construction part having no operating portion is placed on the passage part.

In the process 508, the created construction model layout is transmitted to the output unit.

The above processes 501 to 508 are the contents of the processing in the arithmetic device. The placement processing unit performs the placement process at the position where the minimum required area of the process 506 all overlaps with the areas directly above the passage part and the working portion contacts with the passage part, so that the layout that does not consider the function of the equipment in the building can be excluded, the construction model layout can be created, and the calculation time can be shortened. As a result, the man-hours to create the layout can be reduced.

In the above description, the example in which the construction model layout is regarded as a two-dimensional plane from the directly above area has been described.

When the construction model layout is regarded as three-dimensional to perform the placement, the placement process is performed at a position where the minimum required area all overlaps with the area directly above the passage part.

When the construction model layout is regarded as three-dimensional, the minimum required area may be not only two-dimensional but also a three-dimensional area, and all areas overlapping with the area directly above the passage part may be all areas or all volumes.

In this example, the area directly above refers to an area directly above an upper surface of the passage part in a height direction of the construction model layout. The area directly above in the present invention includes the upper surface of the passage part.

By the above processing, the same effects as those when the construction model layout is two-dimensional can be obtained even when the construction model layout is three-dimensional.

Example 2

In the first example, the construction model layout is automatically created taking into consideration a relative position of the passage and the equipment in the building. However, there is a problem that the number of potentially considerable construction model layouts is enormous, and a creation time of the construction model layout is enormous, or it takes a large number of man-hours to select the layout actually used from a huge number of layouts.

In a second example, conditions are given to the specifications of the construction model parts and only the construction model layout that satisfies the conditions is created, so that a calculation time of the layout creating process and the man-hours to select the created layout are shortened as compared with the first example, and the man-hours to create the construction model layout can be reduced.

<Configuration of the Invention>

Figure 6:
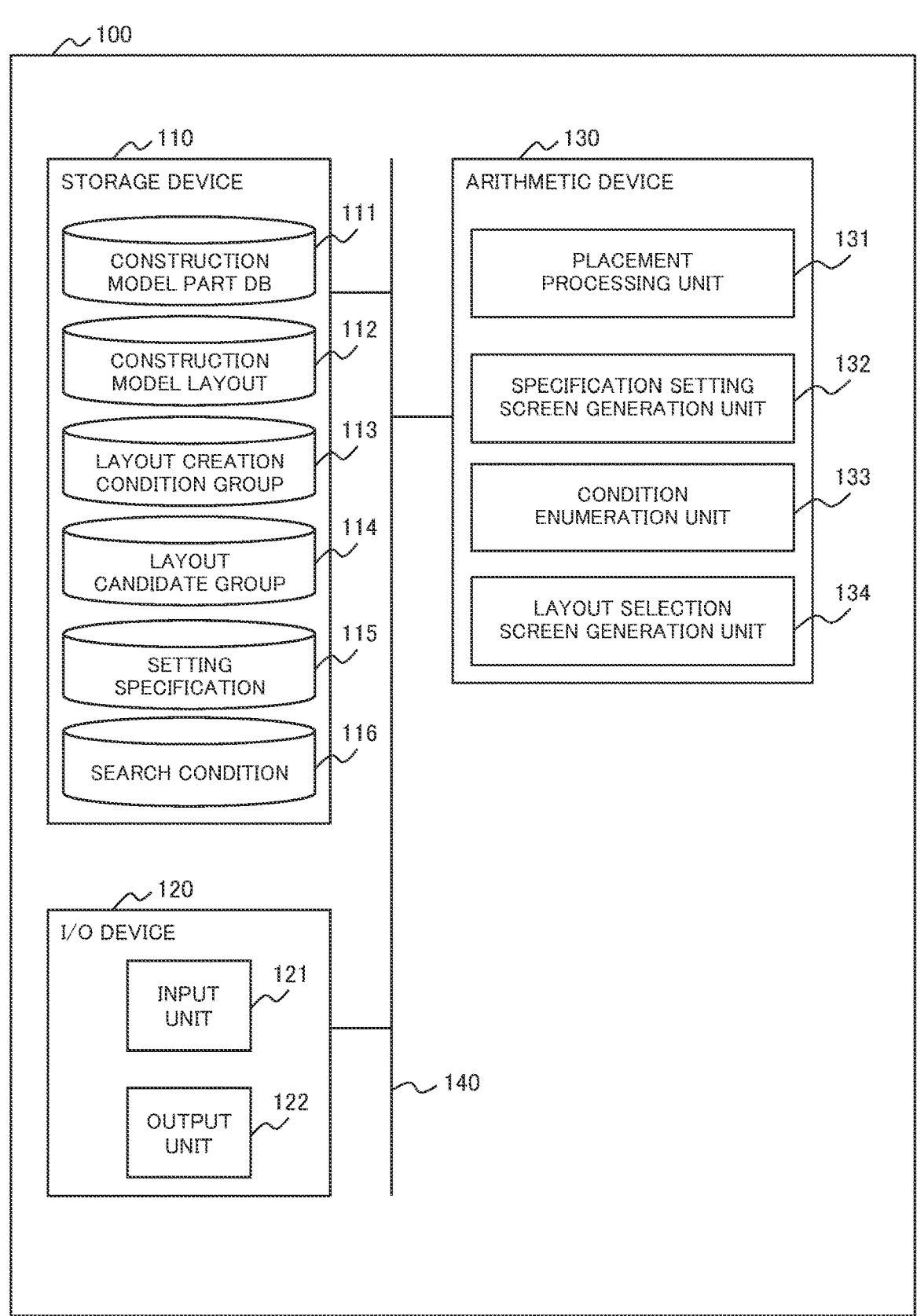
FIG. 6 is a diagram showing an example of the configuration of a construction-model-creating device according to the present invention.

The configuration of a device in the second example will be described with reference to FIG. 6. In the following description, differences from the first example will be described mainly.

The configuration of the second example, in addition to the configuration of the first example, includes a layout creation condition group 113 and a layout candidate group 114 in the storage device, and a specification setting screen generation unit 132, a condition enumeration unit 133, and a layout selection screen generation unit 134 in the arithmetic device.

<Description of Data>

Next, data used in the construction-model-creating device 100 will be described. The description of the construction model part DB 11 and the construction model part group 112 will be omitted.

A setting specification 115 is a flag indicating whether or not specification information on equipment in a building and a passage set by a user is set and is data to be managed.

A search condition 116 is a condition group used for the condition search when enumerating a layout creation condition group 113. That is, the search condition 116 is a set of the specification conditions which are conditions restricting at least one specification of the construction part and the passage part, or conditions for setting a search unit when searching for the specification that satisfies the specification conditions.

Examples of search conditions include a width of the passage, an upper limit and a lower limit of a depth, a search unit, an installation range of an escalator and a security gate, a surveillance camera, an upper limit and a lower limit of the installation position, the search unit, and so on.

The layout creation condition group 113 is a set of layout creation conditions that record the specifications of the construction part including at least a positional relationship with the passage part. A placement process of construction model parts is performed according to the layout creation conditions. The layout creation conditions are the setting specifications or the specification information on the equipment in the building and the passage, and the specification information on the construction mode part determined according to the search conditions. Further, each condition in the layout creation condition may have priority information.

That is, if the other condition cannot be satisfied in order to satisfy one condition, an operation that automatically changes the low priority condition to a condition that satisfies the high priority condition in order to satisfy the high priority condition is allowed.

The layout candidate group 114 is a set of layout candidates corresponding to each layout creation condition in the layout creation condition group 113.

In other words, the layout candidate is layout information corresponding to one layout creation condition among the layout creation condition group 113, and includes information on at least one of the construction model layout created by the corresponding layout creation condition and the corresponding layout creation condition.

<Description of Processing>

Figure 7:
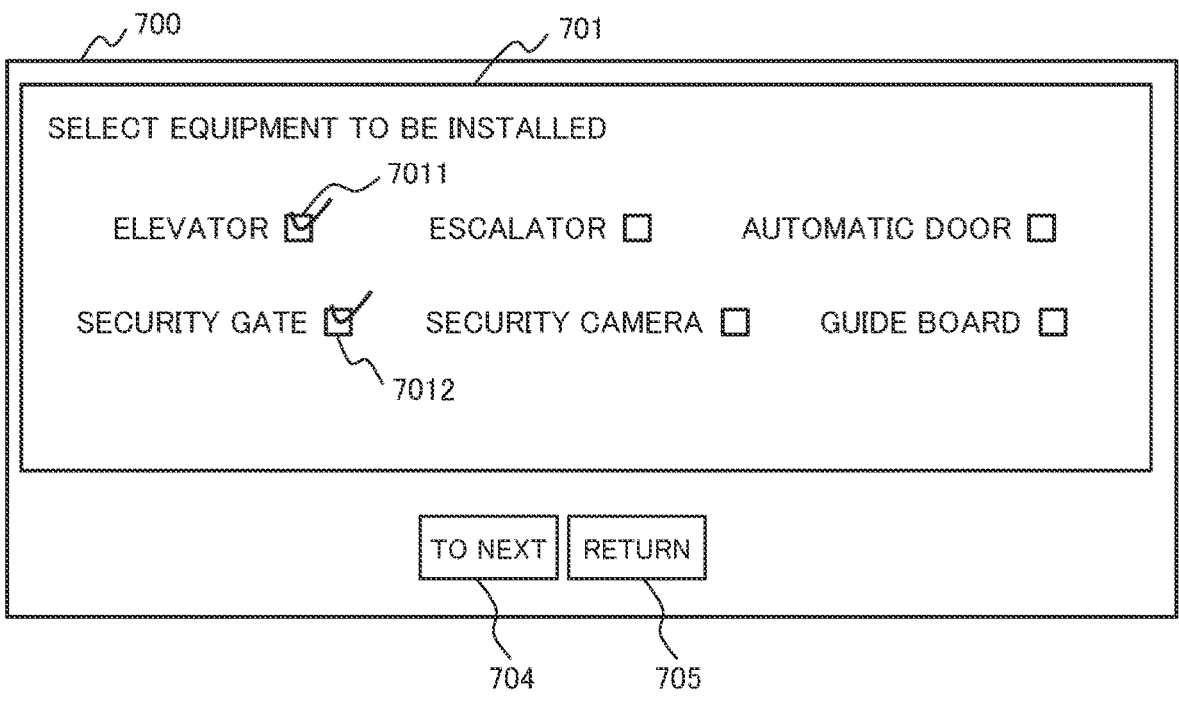
FIG. 7 is a diagram showing one example of a specification setting screen according to the present invention.
Figure 9:
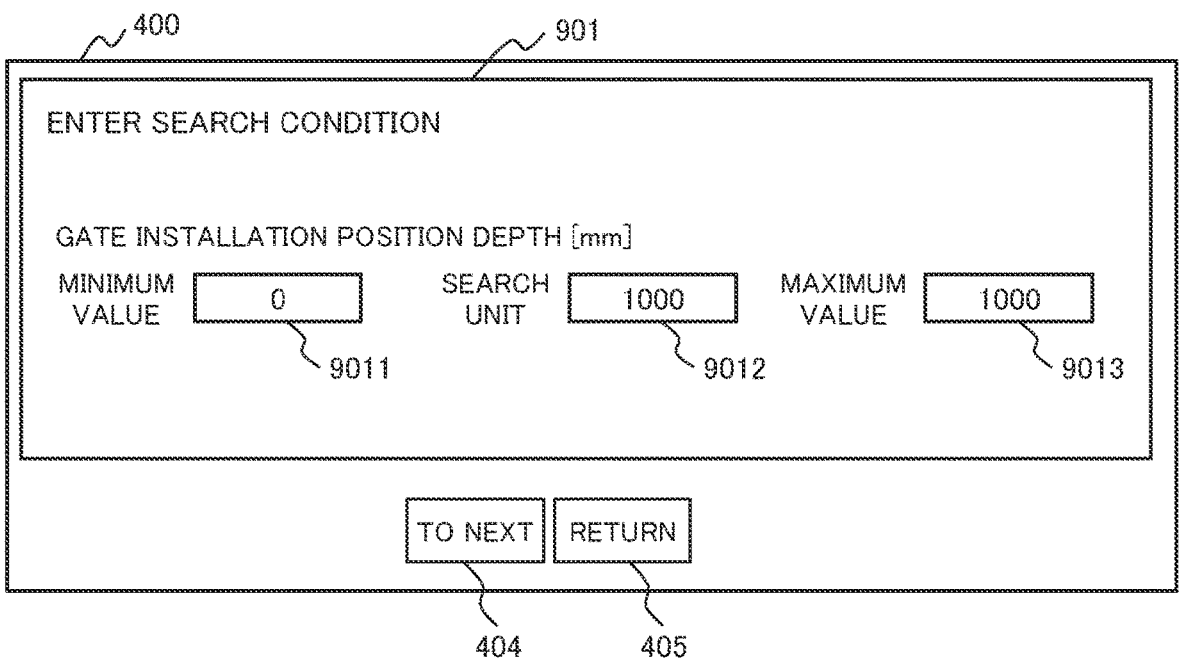
FIG. 9 is a diagram showing an example of the specification setting screen according to the present invention.

A description of the specification setting screen generation unit 131 is performed with reference to FIGS. 7, 8, and 9. In the specification setting screen generation unit 131, a specification setting screen 700 for designating the type of equipment in the building to be installed, the specification of the equipment in the building, the installation position, the type of search conditions to be set in the search condition group 115, and the condition value is created in response to a request for generation of a specification setting screen by a user mouse operation or the like, and the specification setting screen 700 is displayed by transmitting the data to the output unit 122.

An example of the specification setting screen 400 will be described with reference to FIGS. 7, 8, and 9. In the present example, the screens 701, 801, and 901 shown in FIGS. 7, 8, and 9 are separate screens, and each screen display is described as being transitioned by pressing a button that prompts a screen transition. Actually, all or some of each of the screens 701, 801, and 901 may be displayed at the same time.

FIG. 7 shows an example of a screen for selecting the type of the equipment in the building to be installed in the specification setting screen 700. On this screen, the operation screen 701 that allows at least one type of the construction model parts stored in the construction model part DB 111 to be selected is displayed. The selection method may be a checkbox method as shown in 701, or another selection method such as a combo box method may be used, but it is desirable to be able to select a plurality of items at the same time.

When the user selects at least one item and presses a button 704 indicating transition to the next screen, the specification setting screen 700 changes its display content to the screen 801 for setting the specification of the equipment in the building shown in FIG. 8.

On the screen 801, specification information of the equipment in the building and the passage imitated by the construction model part selected in the screen 701 by the user is entered. For example, when an elevator and a security gate are selected on the screen 701, the specification input screen 802 for the elevator and the specification input screen 803 for the security gate are displayed. The specification information to be entered in this situation is a condition value related to the specification information on the construction model part stored in the construction model part DB.

Each of the specification input screens 802 and 803 is configured to select specifications designated by the user. For example, as shown in FIG. 8, whether or not to enter the specification is designated in a check box 8023, and only the checked specification is accepted for specification input on the user side. The specification input may be in a selection format such as a check box or combo box, or may be a format of directly entering in a text box.

When the user designates a specification and presses the button 704 indicating that the user transitions to the next screen, the specification setting screen 700 transitions to the search condition designation screen 901 shown in FIG. 9.

In the search condition designation screen 901, search conditions for specifications 8022 and 8032 that have not been designated by the user on the screen 801 are designated. In particular, for those whose values are not finite, the user is requested to set a minimum value 9011 of the search, a search unit 9012, and a maximum value 9013 of the search. If there is no designation of search conditions, a huge amount of specification conditions can be considered, so that when enumerating specification conditions in the condition enumeration unit 132, a search space becomes enormous and the calculation time increases.

Therefore, in the present example, the search condition is set so that a layout that does not satisfy the search condition set by the user, that is, a layout not desired by the user is prevented from being created in advance, and the calculation time is prevented from being increased because the layout to be created is reduced. Note that a default value may be given in advance for the minimum value 9011, the search unit 9012, and the maximum value 9013.

When the button 704 indicating a transition to the next screen is pressed on the search condition designation screen 901, the specification information 8021 and 8031 set by the user among the item information set on the specification setting screen 700 are stored in the storage unit 110 as the setting specification 115, and the conditions designated in the search condition designation screen 901 are stored in the storage unit 110 as the search condition 116.

The contents of the processing of the specification setting screen generation unit have been described above. As a result, the setting specification and search conditions designated by the user are determined, so that the specification to be proposed to the user is ready for search.

Subsequently, the contents of the processing of the condition enumeration unit 133 will be described. The condition enumeration unit 133 enumerates specifications that have not been set by the user based on the setting specifications 115 and the search conditions 116 set in the specification setting screen generation unit.

If there are multiple specifications that have not been set by the user, the condition enumeration unit 132 enumerates the combinations of those specifications. For example, when the setting specification 115 and the search condition 116 are designated by input as shown in the screen 701, the screen 801, and the screen 901, the condition enumeration unit 132 enumerates all combinations of unset specifications 8022 and 8032. As an elevator placement method, if there are two types of plane and face to face, a total of four conditions are enumerated, that is, the plane and a gate installation position depth of 0 mm, the plane and the gate installation position depth of 1000 mm, the face-to-face and the gate installation position depth of 0 mm, and the face-to-face and the gate installation position depth of 1000 mm. The enumerated condition group is stored in the layout creation condition group 113.

The contents of the processing of the condition enumeration unit 133 have been described above. As a result, the specifications of the equipment in the building and the passages proposed to the user are determined.

Subsequently, the contents of the processing of the placement processing unit 131 will be described. The placement processing unit performs the construction model parts that satisfy the search conditions according to the layout creation conditions, in addition to the placement process in which the operating portion 113 described in Example 1 and the passage part come into contact with each other, and the construction part and the passage part are placed at a position where all the minimum required area 114 overlaps with the passage part. The layout creation condition that satisfies the search conditions and the construction model layout created by performing the placement process according to the layout creation condition are one of the layout candidates.

In this example, as the method for creating the layout candidate, there is a method in which it is determined whether or not the layout creation condition when the construction model part is placed satisfies the search condition, and if the layout creation condition is satisfied, the layout creation condition satisfying the search condition is set as the layout candidate, and a method in which the layout creation condition when the construction part and the passage part are placed at a position that satisfies the search conditions is set as the layout candidate.

Therefore, since only the layouts that satisfy the search conditions set by the user are created, the time for the user to select the layout is shortened, and the man-hours to create the layout can be reduced.

In addition, in the case of a method in which the layout creation condition when the construction part and the passage part are placed at a position that satisfies the search condition is set as a layout candidate, the placement process is performed at a position that satisfies the search condition. For that reason, since the placement process is prevented from being performed at a position where the search condition is not satisfied, the calculation time for performing the placement process of the construction part and the passage part can be shortened, and the man-hours to create the layout can be reduced.

Next, the contents of the creation process of the layout candidate group will be described with reference to FIG. 10.

The layout creation process is performed by the placement processing unit 131, the specification setting screen unit 132, and the condition enumeration unit 133.

A process 1001 and a process 1002 denote the specification setting screen unit, a process 1003 and a process 1004 denote the condition enumeration unit, and a process 1005 to a process 1008 are performed in the placement processing unit.

How the layout candidate group 114 is generated depends on whether there is a construction model layout display request on the layout selection screen. The designation of whether or not there is a construction model layout display request may be switched on a screen by the user, or the designation may be switched by determining by the placement processing unit that a calculator load on the layout candidate display becomes large when the layout candidate becomes enormous.

First, the process 1001 is performed. In this example, it is determined whether all the specifications of the construction model parts have been entered. The process 1004 is performed when all the specifications have been entered, and the process 1002 is performed when all the specifications are not entered.

In the process 1002, the specifications of the input construction model parts are stored in the storage unit as setting specifications of the construction parts and the passage parts.

In the process 1003, unset specification conditions are enumerated according to the search conditions for unentered specifications of the construction model parts in the process 1001. The enumerated set of specification conditions and setting specifications is stored in the layout creation condition group as layout creation conditions. The layout creation conditions are generated for each enumerated specification condition.

In the process, the specification information of the construction model part entered in the process 1004 is stored in the layout creation group as a layout creation condition.

In the process 1005, it is determined whether or not there is a display request for the construction model layout. If there is a request for display of the construction model layout, the processes 1006 to 1007 are executed, otherwise the process 1008 is executed.

In the process 1006, the placement process of the construction model part is performed according to the layout creation condition. What has been placed is the construction model layout.

In the process 1007, a set of the layout creation condition and the corresponding construction model layout are stored in the layout candidate group as layout candidates.

In the process 1008, since there is no display request for the construction model layout, the layout creation condition is stored in the layout candidate group as a layout candidate.

The above processes 1001 to 1008 is a process for creating the layout candidate group. In the above process, since unset conditions are enumerated according to the search conditions of process 1003 and the layout candidates that satisfy the search conditions are created in the process 1006, only the layout candidates within the search condition range set by the user are created. For that reason, extra layout candidates can be prevented from being created. This leads to a reduction in the calculation time and a reduction in the layout selection time of the user, and therefore the man-hours are reduced.

Figure 11:
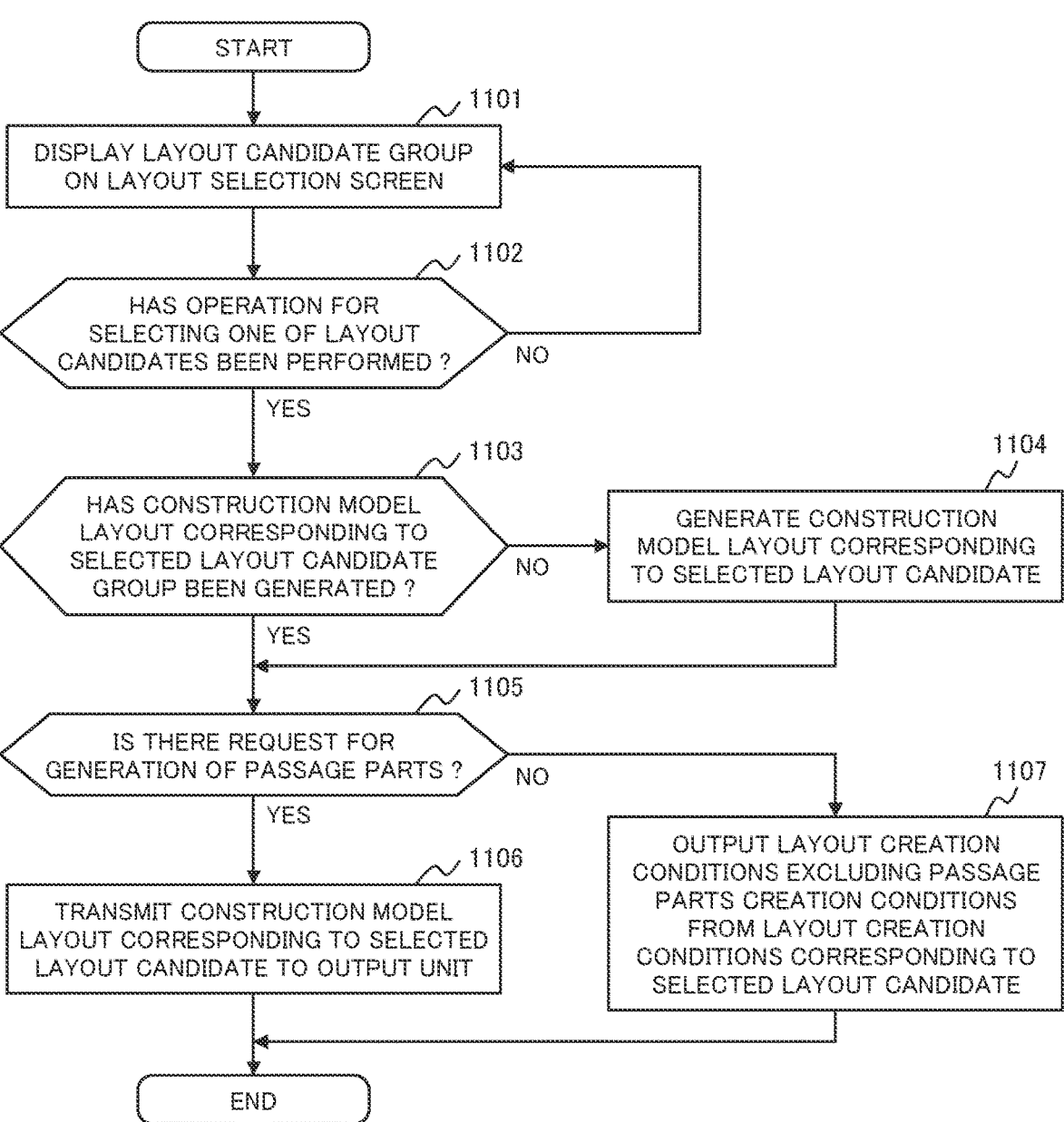
FIG. 11 is a diagram showing an example of processing of a layout selection screen generation unit according to the present invention.

Next, the contents of the processing of the layout selection screen generation unit 134 will be described with reference to FIGS. 11 and 12. The layout selection screen generation unit generates a screen in which a user can confirm a plurality of layout candidates stored in the layout candidate group at the same time and transmits the screen to the output unit, and the output unit outputs the layout candidates. When one of the layout candidates is selected by the user, the construction model layout corresponding to the selected layout candidate is transmitted to the output unit and displayed.

A plurality of layout candidates can be confirmed at the same time so that the user can select a layout while comparing multiple layout candidates with each other, and therefore the user can help grasp a difference between each layout candidate.

Note that the above-described layout candidates include information on either the construction model layout or the layout creation condition created according to the layout creation conditions. The layout candidate output in this state may be at least one of the layout creation conditions and the construction model layout created according to the layout creation conditions.

First, the process 1101 is performed. In the process 1101, each layout candidate of the layout candidate group 114 is displayed on the layout selection screen. The number of layouts to be displayed may be one or several.

Figure 12:
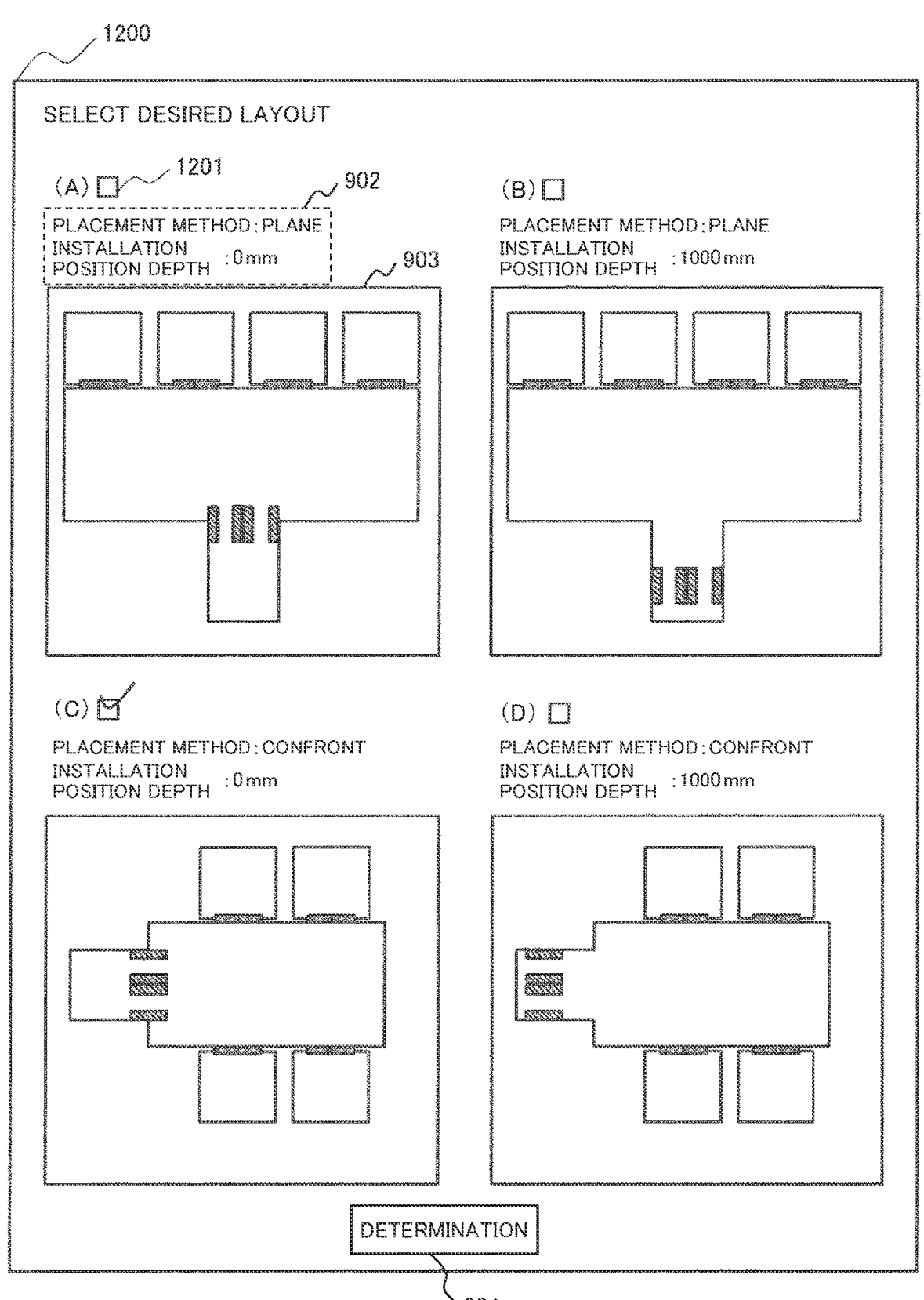
FIG. 12 is a diagram showing an example of a layout selection screen according to the present invention.

An example of a layout selection screen is shown in FIG. 12. The layout selection screen 1200 includes a set of a layout selection field 1201, a layout creation condition 1202, and a construction model part group 1203. However, those configurations are examples, and a part of the configurations may be omitted or a configuration may be added.

As for the display contents of the layout candidate on the layout selection screen, a part of the construction model layout and the layout creation condition may be displayed at the same time as shown in FIG. 12, or either the construction model layout or the layout creation condition may be displayed.

In the process 1102, it is detected whether or not an operation in which one of the layout candidates is selected has been performed by the user. The operation in which the layout candidate is selected means, as exemplified in FIG. 12 that a decision button 1204 is pressed while the layout selection field 1201 is selected. When this operation is performed, the control proceeds to a process 1103. On the other hand, when this operation is not detected, the control returns to the process 1101 and continue to display the layout selection screen 1200.

In the process 1103, it is determined whether or not the construction model layout corresponding to the selected layout candidate has already been generated. If a construction model layout has already been generated for display on the layout selection screen, the control proceeds to the process 1105. Otherwise, the control proceeds to a process 1104.

In the process 1104, a construction model layout corresponding to the selected layout candidate is created. For example, in the process for creation, for example, the processes 1001 to 1004 in FIG. 10 may be used. After completion of processing, the control proceeds to the process 1105.

In the process 1105, it is determined whether there is a request for generation of passage parts. The presence or absence of a passage part generation request may be set by the user on the layout selection screen 1200 or may be defined in advance in the system. If there is a request for the generation of construction model parts of the passage, the control moves to a process 1106, and otherwise the control moves to a process 1107.

In the process 1106, the construction model layout corresponding to the selected layout candidate is displayed by transmitting the construction model layout to the output unit. Furthermore, the output construction model layout is stored in the storage device 110.

In the process 1107, the construction model layout 112 excluding the conditions of the passage part from the layout creation condition corresponding to the selected layout candidate is transmitted to the output displayed by transmitting it to the output unit and then displayed, and stored in the storage device 110.

The above processes 1101 to 1107 are the contents of the processing of the layout selection screen generation unit. Each layout candidate of the process 1001 is displayed on the layout screen, so that the user can check and select a plurality of layout candidates stored in the layout candidate group at the same time. When only the construction part is placed in the layout in which the passage part is placed, it is determined whether or not the passage part needs to be generated in the process 1105 to perform the processing that does not require the passage part generation so that the specification condition of the passage part is deleted among the layout creation conditions, and the layout creation condition including only the specification condition of the construction part can be output. The construction part is placed in the layout where the passage part is placed according to the output layout creation conditions, so that the calculation time to output the layout that is unlikely to be desired by the user and the time to select the layout by the user are shortened, and the man-hours to create the layout can be reduced.

Further, it is determined whether or not the passage part of the process 1105 needs to be generated, so that when the construction part is placed according to the specification condition of the construction part of the layout creation condition on the layout in which the passage part is placed, the layout creation condition in which the specification condition of the passage part of the layout creation condition is deleted is output, and the construction part can be placed in the layout in which the passage part is placed according to the layout creation condition. This process reduces the processing of outputting extra layouts and reduces the man-hours of layouts created.

The present example has been described above. With the above configuration, a plurality of layout candidates enumerated with respect to the specifications of the equipment in the building and the positional relationship with the passage are checked simultaneously, so that the user selects a layout candidate after comparing the validity of the layouts, and the construction model layout for the layout candidate can be used for the design of the actual building. As a result, since design rework can be suppressed, a reduction in the man-hours of design can be performed.

Example 3

<Configuration of the Invention>

Figure 13:
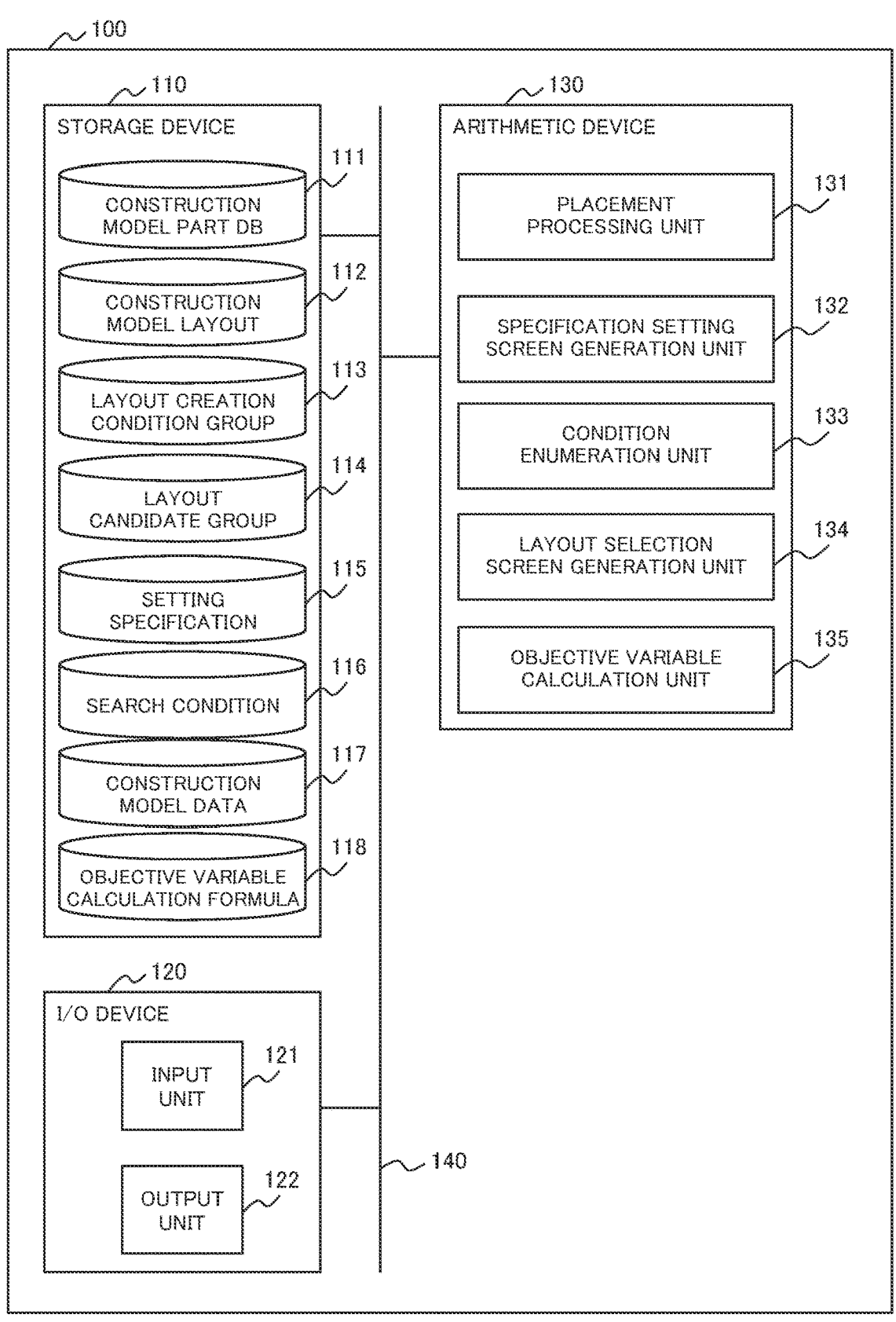
FIG. 13 is a diagram showing an example of the configuration of the construction-model-creating device according to the present invention.

The configuration of the device in a third example will be described with reference to FIG. 13. In the following description, differences from the second example will be mainly described.

The configuration of the device in the third example adds the construction model data 117 and the objective variable calculation formula 118 in the storage device 110 to the configuration of the device in the second example, and adds the objective variable calculation unit 135 in the arithmetic device 130.

<Description of Data>

A description of a construction model part DB 111, a construction model part group 112, a layout creation condition group 113, a layout candidate group 114, and a setting specification 115 will be omitted because they are the same as in the first example.

The search condition 116 is a condition group used for condition search when enumerating the layout creation condition group 113. That is, the search condition 116 is a set of conditions that impose conditions on determining the specification information of the construction parts or the passage parts, or conditions of designating a search unit when searching for specification conditions. The search condition is not a direct condition to the specification condition but may be a restriction on the objective variable value calculated from the specification information or a condition value for calculating the objective variable.

As an example, there are objective variable value constraints such as a generation range of layout candidates, the lower and upper limits of the installation cost of equipment in the building, the lower and upper limits of the total area occupied by the equipment in the building and the passages, a 5-minute transport capacity calculated by an elevator traffic calculation, the lower and upper limits of the average operating interval, a personnel in the building for calculating the lower and upper limits, the lower and upper limits of the transport power calculation value of escalators, the lower and upper limits of a theoretical traffic volume of automatic doors, and the lower and upper limits of a total throughput of security gates, and search conditions such as the upper and lower limits and search unit of the width and depth of the passage, and the upper limit, the lower limit and the search unit of the installation position of the escalators, the security gates, and surveillance cameras.

The construction model data 117 is construction model data of a user-designed building. The data includes at least one element of the construction model parts of floors, walls, columns, stairs, and windows.

The objective variable calculation formula 118 is a calculation formula for a value set on the objective variable in the search condition 116. For example, the traffic calculation formula of elevators, the throughput calculation formula of escalators, automatic doors, security gates, the detection range calculation formula of surveillance cameras and other motion sensors, the visible range calculation formula of information boards, the installation cost calculation formula of equipment in the building and the calculation formula of the floor occupied by the floor fall under this category.

<Description of Processing>

First, the placement processing unit will be described. In the placement processing unit, conditions by the objective variable value are added to the search conditions, and the layout candidate that satisfies the objective variable value is transmitted to the output unit and output, in addition to the placement process in which the operating portion 113 described in Example 1 comes into contact with the passage part, and the construction part and the passage part are placed at a position where the minimum required area 114 all overlaps with the passage part, and the placement process of the construction model part that satisfies the search conditions according to the layout creation conditions in the first and second examples.

Further, when an interference prohibition member is set, a placement process is performed at a position where the construction model part does not interfere with the interference prohibition member, that is, the construction model part and the passage part do not overlap with the interference prohibition member.

In this example, the interference prohibition member is, for example, part information that simulates walls, pillars, stairs, or the like included in the construction model data described above, and cannot be placed by overlapping construction model parts. Note that the interference prohibition member is not limited to those included in the construction model data, and may be set by the user within the installation range.

Through the above processing, the calculation time of the layout creation process and the man-hours to select the created layout can be shortened by reducing the creation of layout candidates that are unlikely to be desired by the user, such as a layout placed outside the objective variable range and at a position where the construction model part overlaps with the interference prohibition member, than in the first and second examples, and the man-hours that create the construction model layouts can be reduced.

Figure 15:
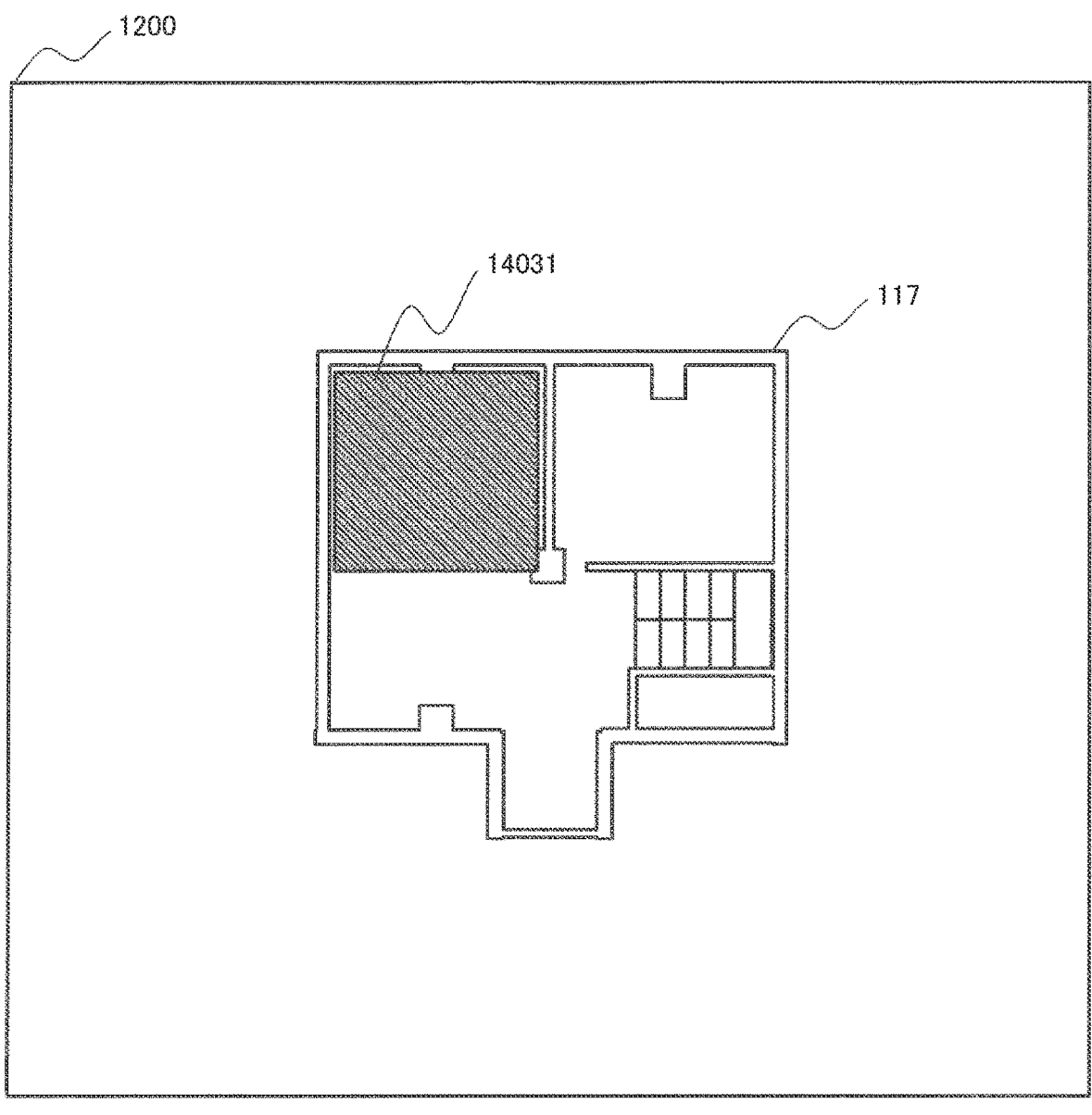
FIG. 15 is a diagram showing an example of the specification setting screen according to the present invention.

Next, a description of the specification setting screen generation unit 132 is performed with reference to FIGS. 14 and 15. In the specification setting screen generation unit 132, in response to a specification setting screen display request due to a user's mouse operation or the like, a specification setting screen 400 for designating the type of equipment in the building and the passage to be installed, their specifications, the type of search conditions to be set in the search condition, and the condition value are created, and their data is transmitted to the output unit 122 to display the specification setting screen 400.

In addition to the configuration of the first example, the specification setting screen 400 may include condition setting units 1402 and 1403 related to the objective variable calculated by the objective variable calculation unit 135. Examples of conditions for the objective variables include a minimum value 14021 and a maximum value 14022 for 5-minute transport capacity in an elevator traffic calculation, minimum and maximum values for average operating intervals, minimum and maximum values of throughput for escalators, automatic doors and security gates, minimum and maximum values for the detection range of surveillance cameras and motion sensors, the minimum and maximum values of a visible range of the information boards, the minimum and maximum values of the installation cost of the equipment, the maximum value of the minimum value of the equipment occupied by the area, the minimum and maximum values of the installation range of the equipment, and so on.

Further, a part of the specification setting in the specification setting screen 400 may be set while referring to the construction model data 117. For example, when setting an installation range condition 14031 of the construction model part, the user may press a selection button 14032 in FIG. 14 to transition to a range selection screen 1500 in FIG. 15, and set the installation range 14031 while referring to the construction model data 117. When the method referring to the construction model data 117 is used, in addition to the installation range 14031 of the construction model part, non-interference constraints with other construction model parts such as walls and pillars within the installation range may be set.

The conditions set on the specification setting screen 400 are stored in the storage unit as setting conditions 115 and search conditions 116 as in the second example. The description of the specification setting screen generation unit 131 has been made above.

The processing contents of the condition enumeration unit 133 are the same as those of the first example, and therefore a description thereof will be omitted.

Figure 16:
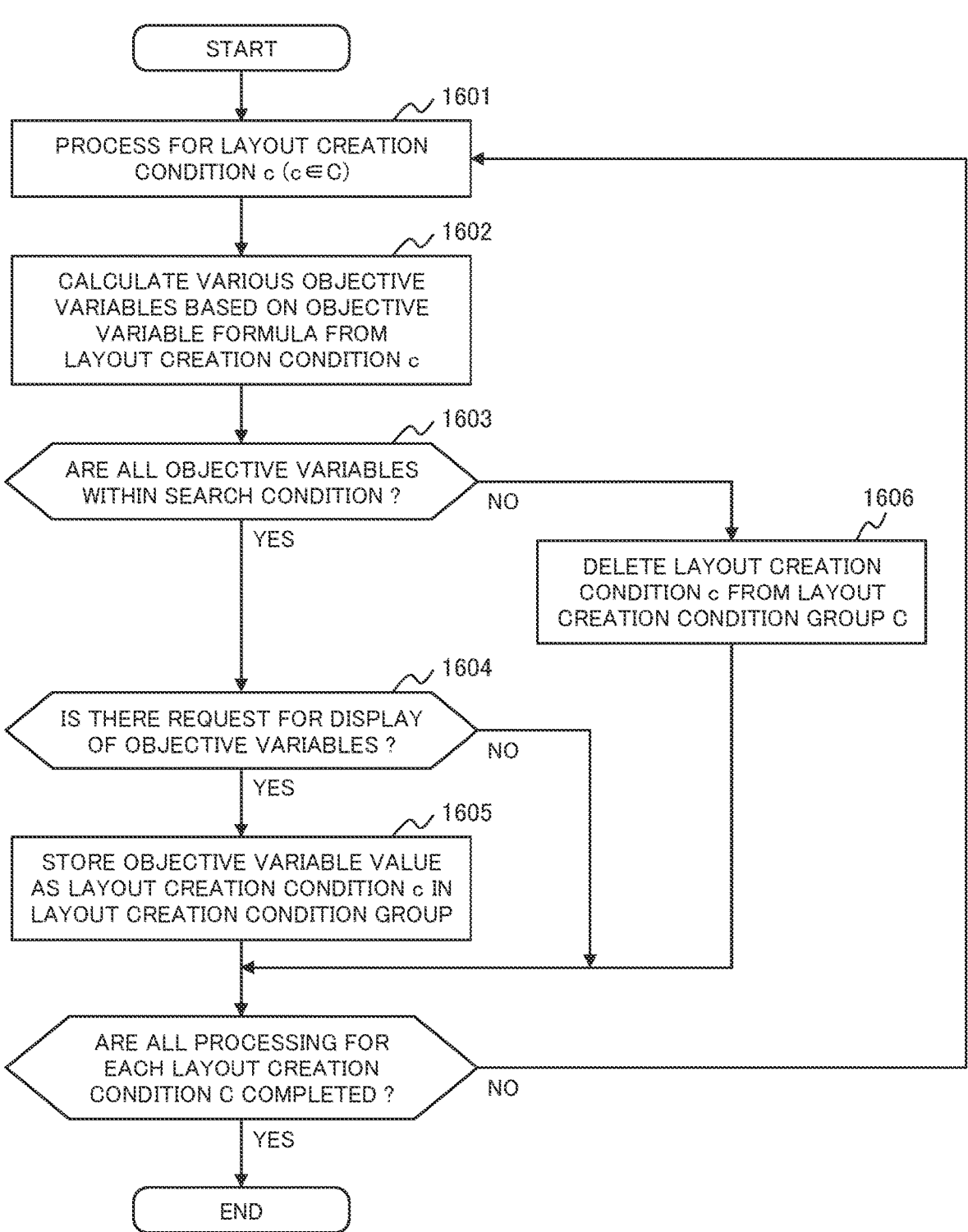
FIG. 16 is a diagram showing an example of the processing of an objective variable calculation unit according to the present invention.

Next, the processing contents of the objective variable calculation unit 135 will be described with reference to FIG. 16.

First, a process 1601 is performed. In the process 1601, when the layout creation condition group 113 is set to C, processes 1602 to 1606 are repeatedly executed for each layout creation condition c ($c \in C$).

In the process 1602, each objective variable is calculated from the layout creation condition c based on the objective variable calculation formula 118. Further, for the calculation of some objective variables such as occupied area, dimensional information of the construction model obtained from the construction model part DB 111 corresponding to the layout creation condition c may be used.

In the process 1603, it is determined whether all the objective variables calculated in the process 1602 fall within the range set in the search condition 116. When it is determined to fall within the range, the control moves to the process 1604, and when it is determined to be outside the range, the control moves to the process 1606.

In the process 1604, it is determined whether there is a display request for the objective variable. In this example, the presence or absence of the display request for the objective variable may be set by the user or may be specified in advance in the system. If there is a display request, the control proceeds to the process 1605.

In the process 1605, the objective variable value is stored in the layout creation condition group as the layout creation condition c. The stored objective variable value may be displayed as a layout candidate.

In the process 1606, the layout creation condition is deleted from the layout creation condition group 113.

The above processes 1601 to 1604 are the contents of the process in the objective variable calculation unit. That is, the layout creation condition in which the objective variable is not within the designated range is deleted, and only the construction model layout whose objective variable value satisfies the search condition is output. Through the above process, only the layout candidates that are more suitable for the user are output to the screen.

The embodiment in the third example has been described above. As a result, in addition to the effects in the second example, only the layout candidate within the objective variable range set by the user is output to the layout selection screen, so that the layout that is unlikely to be desired by the user such as the layout placed at a position where the construction model part overlaps with the outside of the objective variable range and the interference prohibition member, which is unlikely to be desired by the user, can be prevented from being displayed. This leads to a reduction in calculation time and a reduction in layout selection time for the user, which leads to a reduction in design man-hours.

Example 4

In the first example, a layout considering the function of the equipment in the building is automatically created, and in the second and third examples, the search conditions are set with respect to the specifications of the equipment in the building and the passage, so that the calculation time of the creation of the layout and the layout selection time are shortened by not creating a layout candidate that is unlikely to be desired by the user, and the layout creation man-hour is reduced.

In addition, the multiple layout candidates are displayed at the same time, so that the layout candidates are compared with each other, and the user can select the layout most desired among the layout candidates.

However, the reference information provided by the user in order to select one layout from among the multiple displayed layouts is only specification information that satisfies the search conditions set by the user and drawings of the construction model layout, and when the layout candidate is actually selected, it is not possible to determine what kind of characteristics the layout has.

Therefore, in a fourth example, a simulation is performed on the layout candidate and the simulation result is displayed when selecting a layout, so that the layout candidates are compared with each other based on the simulation result, and the layout most desired by the user among the layout candidates can be selected.

<Configuration of the Invention>

Figure 17:
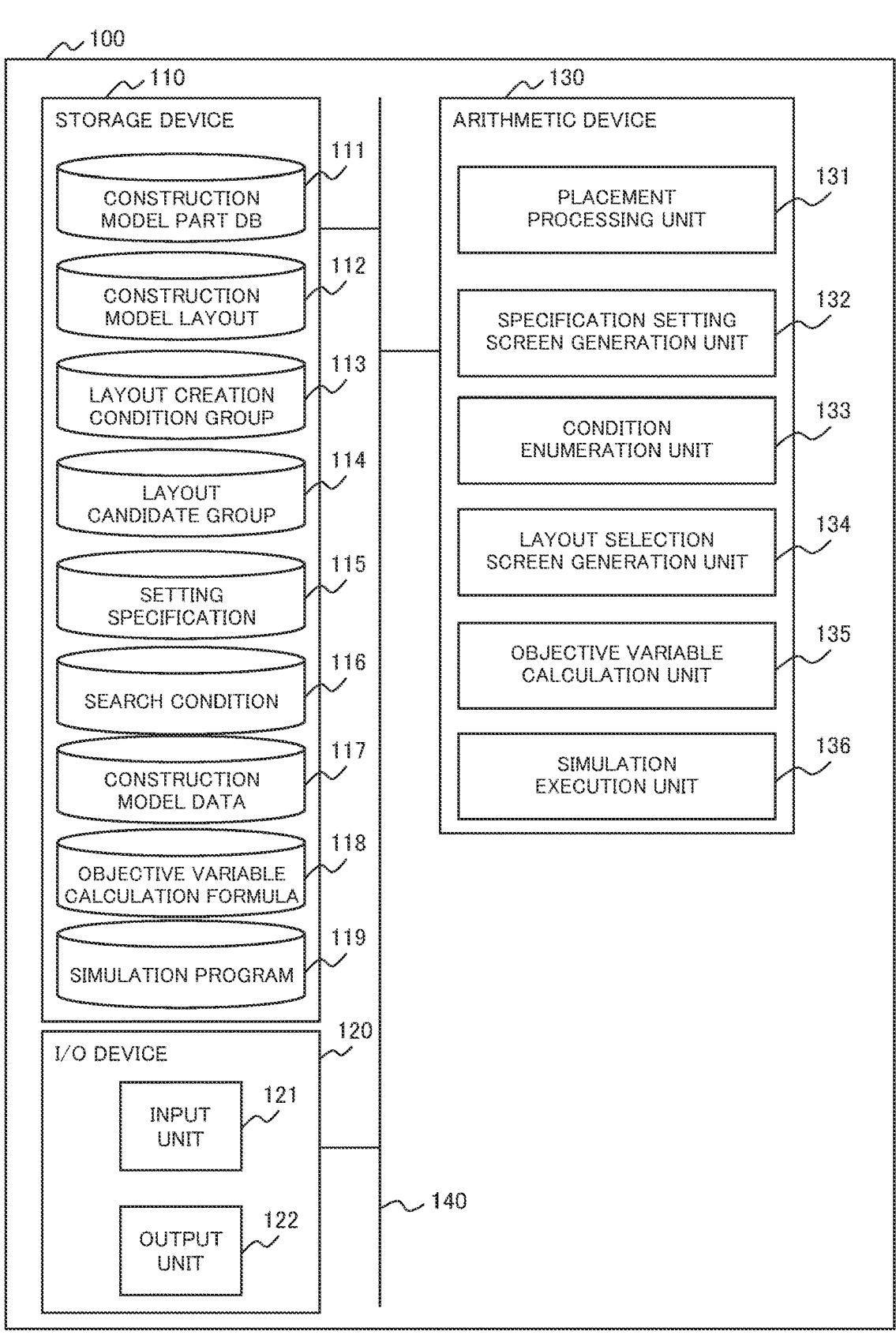
FIG. 17 is a diagram showing an example of the configuration of the construction-model-creating device according to the present invention.

The configuration of the device in the fourth example will be described with reference to FIG. 17. In the following description, differences from the first, second, and third examples will be mainly described. In the configuration of the device in the fourth example, a simulation program 119 is added in the storage device 110 to the configuration of the device in the third example and a simulation execution unit 136 is added in the arithmetic device 130 with respect to the configuration of the device in the third example.

<Description of Data>

The construction model part DB 111, the construction model part group 112, the layout creation condition group 113, the layout candidate group 114, the setting specification 115, the search condition 116, the construction model data 117, and the objective variable calculation formula 118 are the same as those in the first example, and therefore a description thereof will be omitted.

The simulation program 119 is a program for performing a simulation related to equipment in the building. Examples of simulations include simulations of a flow of persons around the equipment, operation simulations of the equipment, lighting simulations around the equipment, maintenance simulations of the equipment, electric simulations, construction simulations, and the like. The simulation program 119 may perform a plurality of types of simulations. The simulation program includes at least one function of displaying the results of the simulation related to the equipment in the building as a moving image or an image and a function of numerical output. Further, sequential drawing may be performed by a drawing program defined by the simulation program 119.

As an example of the output of the simulation result, there are the average waiting time of the elevator, a long waiting rate, the maximum number of persons waiting, a person flow line density, an average walking speed of the persons, and a travel time to a destination in the case of a human flow simulation, a response time in the case of the operation simulation of the equipment, an average illuminance in the case of lighting simulation around the equipment, the maintenance cost in the case of the equipment maintenance simulation, power consumption in the case of the power simulation, and so on.

<Description of Processing>

Since the contents of the processing of the specification setting screen generation unit 131, the condition enumeration unit 132, and the objective variable calculation unit 133 are the same as those of the first, second, and third examples, a description thereof will be omitted.

First, the simulation execution unit will be described. When the simulation execution unit receives a simulation implementation request for a specific layout candidate, the simulation execution unit executes a simulation based on the simulation program, transmits the simulation result to the output unit, and displays the simulation result. Note that the simulation implementation request and transmission of the result may be performed by another processing unit.

Next, a description of the layout selection screen generation unit 134 will be described with reference to FIGS. 17 and 18. In the layout selection screen generation unit, a layout selection screen 1200 on which a layout candidate is displayed is created and transmitted to the output unit for display.

An example of a layout selection screen is shown in FIG. 18. The layout selection screen 1200 includes a layout selection field 1201 and a layout creation condition 1202. However, those configurations are examples, and a screen configuration may be added or reduced. For example, as in the second example, the construction model layout may be included in the layout candidate. The layout creation condition 1202 may include an objective variable value 1802 related to the layout candidate.

The layout selection screen 1200 has a configuration that requests the execution of a simulation based on the simulation program 119 for a specific layout candidate. For example, the simulation execution request button 1801 in FIG. 15 corresponds to the above configuration.

Figure 19:
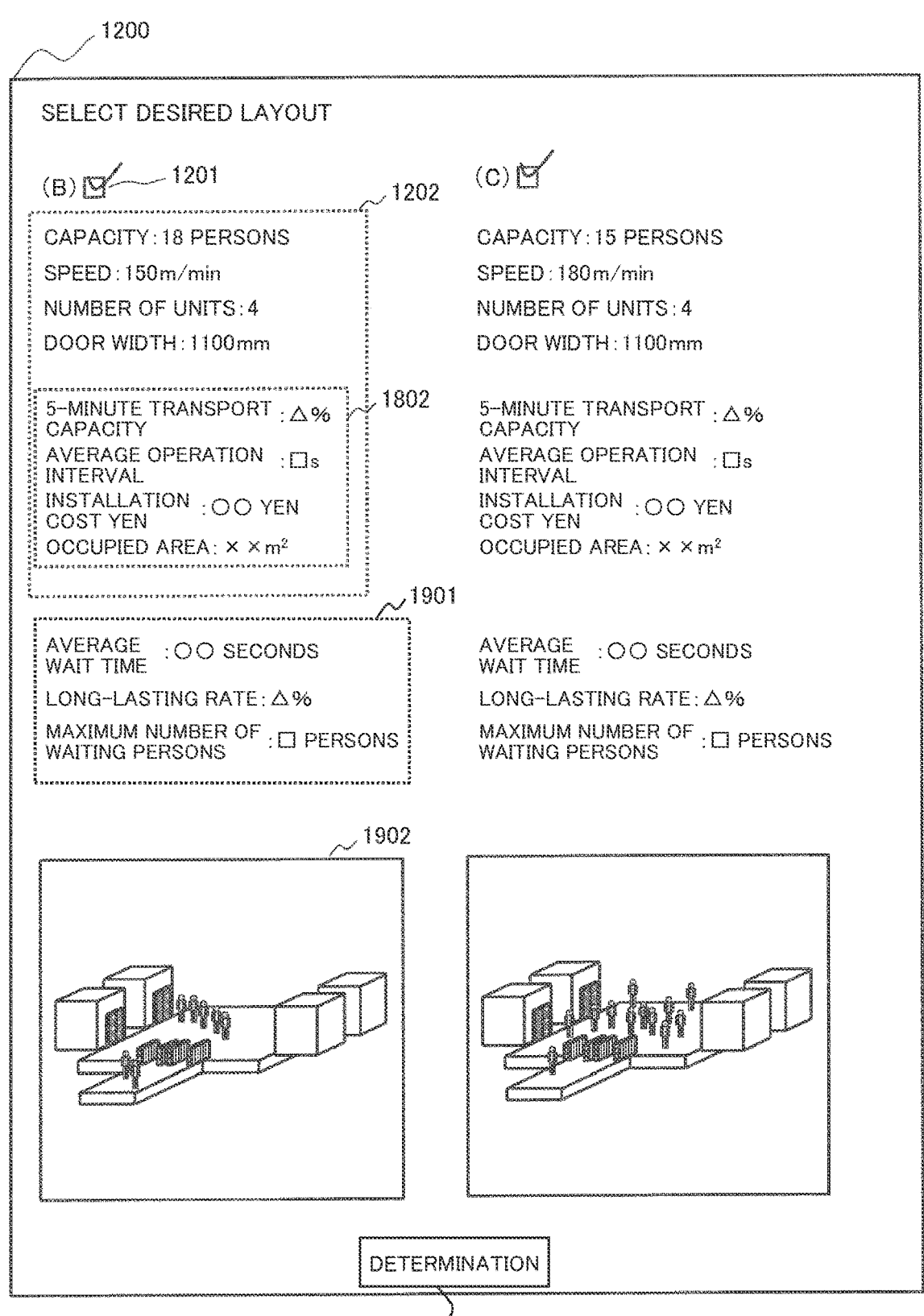
FIG. 19 is a diagram showing an example of the layout selection screen according to the present invention.

After the simulation has been executed, the layout selection screen proceeds to the configuration of FIG. 19. The layout selection screen 1200 includes, in addition to the layout selection field 1201 and the layout creation condition 1202, a simulation numerical result 1901 and a simulation image result 1902.

The simulation results include numerical output such as the simulation numerical result 1901, and an image or a moving image output indicating the movement of the person within a hall such as the simulation image result 1902. The examples given in this example are examples of simulation results.

If the simulation screen 1902 is sequentially drawn by a drawing program defined by the simulation program 119, the display form of the simulation screen such as a display angle may be changed by user operation.

The configuration added in the fourth example has been described above. Since the basic processing contents after the layout selection are the same as those of the second example, and therefore a description thereof will be omitted.

The embodiment in the fourth example has been described above. The simulation results are displayed on the layout selection screen so that the user can confirm the validity of the layout by simulation. Therefore, there is no need to evaluate the layout validity by simulation or recreate the layout after the layout has been determined, which leads to a reduction in design man-hours.

Note that the present invention is not limited to examples described above and includes various modifications. For example, the examples described above have been described in detail in order to illustrate the present invention in an easy-to-understand manner, and are not necessarily limited to those having all the described configurations. A part of the configuration of one example can be replaced with the configuration of another example, and also the configuration of another example can be added to the configuration of one example. Further, it is possible to add, delete, and replace other configurations for a part of the configuration of each example. Further, each of the above configurations, functions, processing units, processing means, and the like may be realized in hardware by, for example, designing a part or all of those components with an integrated circuit. Further, each of the above configurations, functions, and the like may be realized in software by interpreting and executing a program in which the processor realizes each function. Information such as programs, tables, files, and the like that realize each function can be used in memory, hard disk, SSD (Solid State Drive) or on a recording medium such as an IC card, an SD card, or a DVD.

REFERENCE SIGNS LIST

100 . . . construction model device, 112 . . . construction model layout, 116 . . . search conditions, 118 . . . objective variable calculation formula, 119 . . . simulation program, 122 . . . output unit, 130 . . . arithmetic device, 131 . . . placement processing unit, 136 . . . simulation execution unit, 201, 202 . . . construction parts, 203 . . . passage parts, 204 . . . operating portions, 205 . . . required area, 1901 . . . simulation numerical results, 1902 . . . simulation image results

The invention claimed is:

1. A construction-model-creating device that outputs a layout candidate of a construction model layout in which a construction part imitating equipment in a building and having an operating portion and a passage part are placed, the device comprising:

a processor coupled to a memory storing instructions that when executed configure the processor to:

create the layout candidate in which the construction part and the passage part are placed at a position where a minimum required area which is a minimum area required for the equipment in the building to be effective all overlaps with the passage part, on a two-dimensional plane when the construction model layout is viewed from directly above; and output with an output unit the layout candidate created by the processor wherein the layout candidate is information including at least one of a layout creation condition and the construction model layout created by the processor according to the layout creation condition, the layout creation condition is specification information on the construction part and the passage part, the specification information includes first information on the construction part and the passage part, and second information which is placement information on the construction part and the passage part, the first information includes at least one of performance information, a type, and dimension information in the case of the construction part, and at least one of a type and dimension information in the case of the passage part, and the operating portion is a portion in which the building equipment imitated by the construction part interacts with an outside, and includes at least one of an entrance and exit portion of an elevator, a passing portion of a security gate, a display unit of an information display device, and a sensing portion of a sensor.

2. The construction-model-creating device according to claim 1, wherein the processor is configured to create the minimum required area when the minimum required area is not in contact with the construction part.

3. The construction-model-creating device according to claim 1, wherein the processor is configured to determine whether or not a layout creation condition when the construction part and the passage part are subjected to placement processing satisfies a search condition, and sets the layout creation condition that satisfies the search condition or the construction model layout created by the processor according to the layout creation condition that satisfies the search condition as the layout candidate.

4. The construction-model-creating device according to claim 3, wherein the search condition includes a specification condition that limits the specification information of at least one of the construction part and the passage part, or a search unit condition which the processor is configured to set when searching for the specification information that satisfies the specification condition.

5. The construction-model-creating device according to claim 1, further comprising:

the processor being configured to place the construction part and the passage part at a position not to overlap with an interference prohibition member, wherein the interference prohibition member is part information that is included in the construction model layout, and simulates at least one of wall pillars and stairs.

6. The construction-model-creating device according to claim 3, wherein the processor is configured to output a layout candidate having an objective variable value satisfies the search condition, the search condition includes a condition that limits the objective variable value, and wherein the processor is configured to calculate the objective variable value is a value calculated using an objective variable calculation formula based on at least one piece of the specification information on the construction part and the passage part, and the layout candidate includes information on the objective variable value.

7. The construction-model-creating device according to claim 6, wherein the objective variable calculation formula for the objective variable value includes at least one of an elevator traffic calculation formula, a calculation formula for a installation cost of equipment in the building, a throughput calculation formula for an escalator, an automatic door, or a security gate, a detection range calculation formula for a surveillance camera or a motion sensor, a visible range calculation formula for a guide board, and a calculation formula for an occupied area of equipment and floors in the building.

8. The construction-model-creating device according to claim 6, wherein the processor is configured to output at least one of the layout creation condition, the construction model layout created based on the layout creation condition, and the objective variable value as the layout candidate to be output.

9. The construction-model-creating device according to claim 1,
wherein the processor is configured to output a plurality of the layout candidates corresponding to different layout creation conditions.

10. The construction-model-creating device according to claim 1,
wherein the processor is configured to implement simulation based on a simulation program upon receiving a simulation implementation request for a specific layout candidate, and
display at least one of a simulation image result and a simulation numerical result on a display as a simulation result, in which the simulation image result is a result represented by a moving image or an image, and the simulation numerical result is a result of representing the simulation result numerically.

11. The construction-model-creating device according to claim 1,
wherein the construction part and the road part have at least one type of plural types of attributes for each part, and
the processor is configured to place the construction part and the passage part having corresponding attributes at a position of coming into contact with each other.

12. The construction-model-creating device according to claim 1,
wherein the construction part is a part that imitates at least one of an elevator, a security gate, an information display device, and a sensor,
the minimum required area is a rectangular area including the entire operating portion and having a width of 50 cm in a direction perpendicular to the operating portion and separating from the construction part when the construction part imitates any one of the elevator, the security gate, and the information display device, and the minimum required area is an area including a quarter of the operating portion and having a width of 50 cm in a direction perpendicular to a tangential line of the operating portion and separating from the construction part in a whole area of the included operating portion.

13. A construction-model-creating method of creating a construction model layout of a building in which a construction part is placed, the method comprising:
a first step of performing a placement process of the construction part and a passage part; and
a second step of outputting a layout candidate,
wherein the construction part has an operating portion, and
in the first step, the construction part and the passage part are placed at a position where a minimum required area which is a minimum area required for the equipment in a building to be effective all overlaps with the passage part on a two-dimensional plane when the construction model layout is viewed from directly above wherein
the layout candidate is information including at least one of a layout creation condition and the construction model layout created by the arithmetic device according to the layout creation condition,
the layout creation condition is specification information on the construction part and the passage part,
the specification information includes first information on the construction part and the passage part, and second information which is placement information on the construction part and the passage part,
the first information includes at least one of performance information, a type and dimension information in the case of the construction part, and at least one of a type and dimension information in the case of the passage part, and
the operating portion is a portion in which the building equipment imitated by the construction part interacts with an outside, and includes at least one of an entrance and exit portion of an elevator, a passing portion of a security gate, a display unit of an information display device, and a sensing portion of a sensor.

* * * * *